US012776255B2

(12) United States Patent
Chen et al.

(10) Patent No.: US 12,776,255 B2
(45) Date of Patent: Oct. 27, 2026

(54) PIXEL DRIVING CIRCUIT AND DISPLAY APPARATUS

(71) Applicant: Hubei Yangtze Industrial Innovation Center Of Advanced Display Co., Ltd., Wuhan (CN)

(72) Inventors: Xin Chen, Wuhan (CN); Jiaxian Liu, Wuhan (CN)

(73) Assignee: Hubei Yangtze Industrial Innovation Center Of Advanced Display Co., Ltd., Wuhan. (CN)

( * ) Notice: Subject to any disclaimer, the term of this patent is extended or adjusted under 35 U.S.C. 154(b) by 0 days.

(21) Appl. No.: 18/977,860

(22) Filed: Dec. 11, 2024

(65) Prior Publication Data

US 2025/0111824 A1 Apr. 3, 2025

(30) Foreign Application Priority Data

Aug. 30, 2024 (CN) ......................... 202411218598.1

(51) Int. Cl.
*G09G 3/32* (2016.01)
*H10H 29/32* (2025.01)

(52) U.S. Cl.
CPC ....... *G09G 3/32* (2013.01); *G09G 2300/0426* (2013.01); *G09G 2300/0852* (2013.01); *G09G 2300/0861* (2013.01); *G09G 2310/08* (2013.01); *G09G 2320/0233* (2013.01);
(Continued)

(58) Field of Classification Search
CPC ...... G09G 3/32; G09G 3/2014; G09G 3/3233; G09G 2300/0426; G09G 2300/0852; G09G 2300/0861; G09G 2310/08; G09G 2320/0233; G09G 2320/064; G09G 2330/021; H10H 29/32; H10H 29/30
See application file for complete search history.

(56) References Cited

U.S. PATENT DOCUMENTS

| | | | | |
|---|---|---|---|---|
| 2016/0300526 | A1* | 10/2016 | Lim | G09G 3/3233 |
| 2019/0259327 | A1* | 8/2019 | Li | G09G 3/3233 |
| 2022/0076604 | A1* | 3/2022 | Lai | G11C 19/28 |

(Continued)

FOREIGN PATENT DOCUMENTS

| | | |
|---|---|---|
| CN | 112837651 A | 5/2021 |
| CN | 114822384 A | 7/2022 |

*Primary Examiner* — Stephen G Sherman
(74) *Attorney, Agent, or Firm* — Wiersch Law Group

(57) ABSTRACT

A pixel driving circuit and a display apparatus. The pixel driving circuit includes a pulse amplitude modulation circuit and a pulse width modulation circuit electrically connected to each other. The pulse amplitude modulation circuit is electrically connected to a light-emitting element to provide a drive current thereto and is configured to control an amplitude of the drive current. The pulse width modulation circuit is configured to control a pulse width of the drive current. The pulse amplitude modulation circuit includes a light-emitting branch connected to the light-emitting element, which includes a first driving transistor and at least one switching transistor. The at least one transistor is a double-gate double-channel transistor. The introduction of the double-gate double-channel transistor into the light-emitting branch can reduce the current transmission time, lower the power consumption of the pixel driving circuit, and enhance the capability of the pixel driving circuit to output the drive current.

19 Claims, 15 Drawing Sheets

(52) U.S. Cl.
CPC . *G09G 2320/064* (2013.01); *G09G 2330/021* (2013.01); *H10H 29/32* (2025.01)

(56) References Cited

U.S. PATENT DOCUMENTS

| | | | | |
|---|---|---|---|---|
| 2022/0101783 | A1 * | 3/2022 | Han | G09G 3/32 |
| 2023/0410745 | A1 * | 12/2023 | Guo | G09G 3/3233 |
| 2024/0212561 | A1 * | 6/2024 | Zhai | G09G 3/32 |

* cited by examiner

PIXEL DRIVING CIRCUIT AND DISPLAY APPARATUS

CROSS-REFERENCE TO RELATED APPLICATION

The present disclosure claims priority to Chinese Patent Application No. 202411218598.1 entitled "PIXEL DRIVING CIRCUIT AND DISPLAY APPARATUS" filed on Aug. 30, 2024, the content of which is incorporated herein by reference in its entirety.

TECHNICAL FIELD

The present disclosure relates to the technical field of display and, in particular, to a pixel driving circuit and a display apparatus.

BACKGROUND

With the continuous development of science and technology, more and more display products, such as mobile phones, tablet computers, notebook computers, and intelligent wearable devices, are widely used in people's daily life and work, bring great convenience to people's daily life and work, and become people's indispensable important tools today.

At the present stage, how to reduce the power consumption of the display products becomes one of the technical problems to be solved urgently.

SUMMARY

In order to solve the above technical problem, the present disclosure provides a pixel driving circuit and a display apparatus which are intended to reduce the product power consumption.

In a first aspect, the present disclosure provides a pixel driving circuit including a pulse amplitude modulation circuit and a pulse width modulation circuit which are electrically connected to each other. The pulse amplitude modulation circuit is electrically connected to a light-emitting element to provide a drive current to the light-emitting element. The pulse amplitude modulation circuit is configured to control an amplitude of the drive current, and the pulse width modulation circuit is configured to control a pulse width of the drive current. The pulse amplitude modulation circuit includes a light-emitting branch connected to the light-emitting element, the light-emitting branch includes a first driving transistor and at least one switching transistor. The at least one transistor in the light-emitting branch is a double-gate double-channel transistor.

In a second aspect, based on the same inventive concept, the present disclosure further provides a display apparatus including a pixel driving circuit. The pixel driving circuit includes a pulse amplitude modulation circuit and a pulse width modulation circuit which are electrically connected to each other. The pulse amplitude modulation circuit is electrically connected to a light-emitting element to provide a drive current to the light-emitting element. The pulse amplitude modulation circuit is configured to control an amplitude of the drive current, and the pulse width modulation circuit is configured to control a pulse width of the drive current. The pulse amplitude modulation circuit includes a light-emitting branch connected to the light-emitting element, the light-emitting branch includes a first driving transistor and at least one switching transistor. The at least one transistor in the light-emitting branch is a double-gate double-channel transistor.

BRIEF DESCRIPTION OF DRAWINGS

The accompanying drawings herein are incorporated into and constitute a part of this specification, show embodiments consistent with the present disclosure, and are used in conjunction with this specification to explain the principles of the present disclosure.

In order to illustrate the technical solutions in the embodiments of the present disclosure or the technical solutions in the prior art more clearly, the accompanying drawings required to be used in the description of the embodiments or the prior art will be briefly introduced below. Apparently, those ordinarily skilled in the art may still derive other accompanying drawings from these accompanying drawings without creative efforts.

DESCRIPTION OF EMBODIMENTS

In order to more clearly understand the above-mentioned objectives, features and advantages of the present disclosure, the solutions of the present disclosure will be further described below. It should be noted that the embodiments of the present disclosure and the features in the embodiments may be combined with each other without conflict.

In the following description, many specific details are set forth to fully understand the present disclosure, but the present disclosure may be implemented in other manners different from those described herein. It is apparent that the embodiments in the specification are only a part of the embodiments of the present disclosure, not all of the embodiments of the present disclosure.

For a display panel with an inorganic light-emitting diode structure, the inorganic light-emitting diode is connected to a pixel driving circuit, and obtains a drive current through the pixel driving circuit. The operating current of the inorganic light-emitting diode is higher. In the corresponding pixel driving circuit, in order to provide a larger drive current, Vds (a voltage between a source and a drain) and Vgs (a voltage between a gate and a source) required by some transistors will be larger, resulting in an increase in the power consumption of the pixel driving circuit.

In order to solve the problem of high power consumption of the pixel driving circuit, the present disclosure improves the structure of the pixel driving circuit, which will be described below with reference to the accompanying drawings and specific embodiments.

Figure 1:
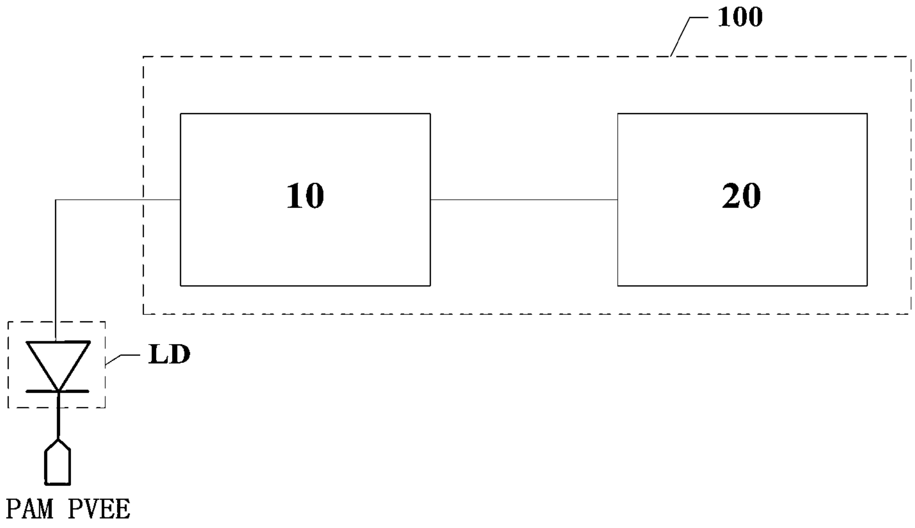
FIG. 1 is a modular schematic diagram of a pixel driving circuit provided by an embodiment of the present disclosure.
Figure 2:
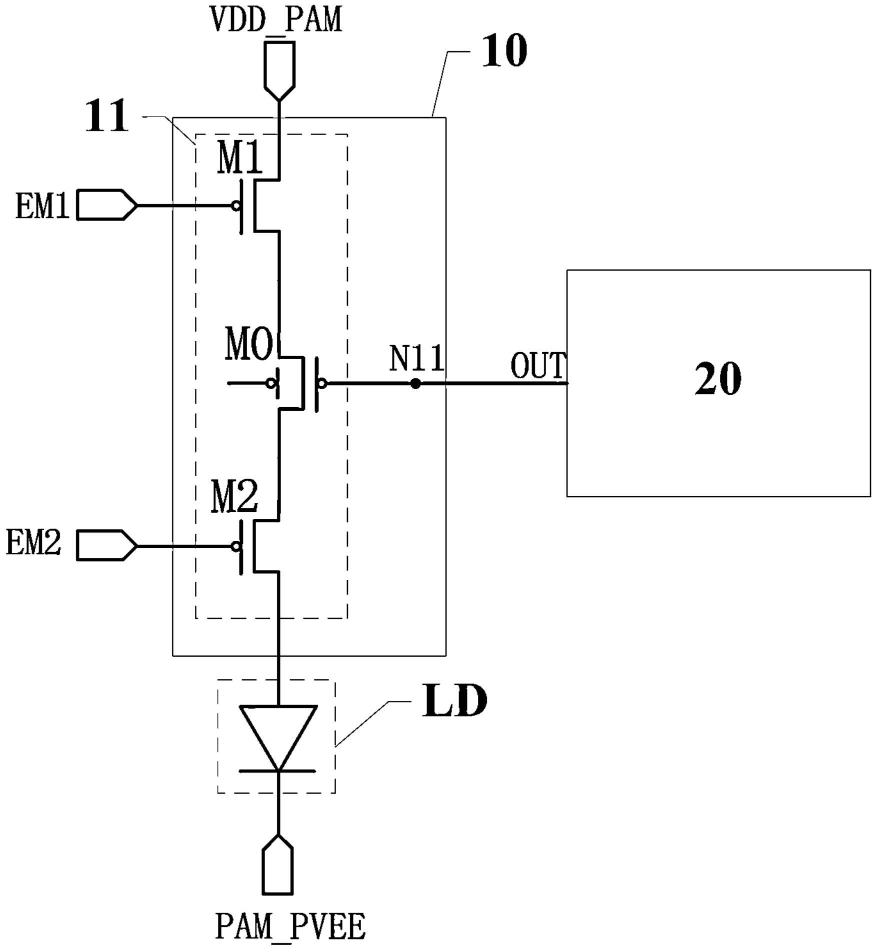
FIG. 2 is a structural schematic diagram of a pixel driving circuit provided by the embodiment of the present disclosure.

FIG. 1 is a modular schematic diagram of a pixel driving circuit provided by an embodiment of the present disclosure. FIG. 2 is a structural schematic diagram of the pixel driving circuit provided by the embodiment of the present disclosure and refines a part of a structure of a pulse amplitude modulation circuit. Referring to FIG. 1 and FIG. 2, the present disclosure provides a pixel driving circuit 100 including a pulse amplitude modulation circuit and a pulse width modulation circuit 20 which are electrically connected to each other. The pulse amplitude modulation circuit 10 is electrically connected to a light-emitting element LD to provide a drive current to the light-emitting element LD. The pulse amplitude modulation circuit 10 is configured to control an amplitude of the drive current. The pulse width modulation circuit 20 is configured to control a pulse width of the drive current. The pulse width of the drive current is understood as a duration of the drive current, and the amplitude of the drive current is understood as a magnitude of a current value of the drive current. The pulse amplitude modulation circuit 10 includes a light-emitting branch 11 connected to the light-emitting element LD. The light-emitting branch 11 includes a first driving transistor M0 and at least one switching transistor (a switching transistor M1 and a switching transistor M2 are illustrated as an example in FIG. 2). At least one transistor in the light-emitting branch 11 is a double-gate double-channel transistor. Optionally, the light-emitting element LD may be a light-emitting diode (LED), such as a mini LED, a micro LED, or the like.

The light-emitting branch 11 of the pulse amplitude modulation circuit 10 mentioned in the present disclosure refers to a branch that is conducted in a light-emitting phase in the pulse amplitude modulation circuit 10. The light-emitting branch 11 is substantially a branch that provides the drive current to the light-emitting element LD to cause the light-emitting element LD to emit light. The light-emitting branch 11 includes the first driving transistor M0 and the at least one switching transistor. It should be noted that the embodiment shown in FIG. 2 shows only the light-emitting branch 11 in the pulse amplitude modulation circuit 10, but does not show other structures in the pulse amplitude modulation circuit 10. In addition, FIG. 2 illustrates the light-emitting branch 11 including one driving transistor and two switching transistors as an example, but this is not a limitation. In some other embodiments of the present disclosure, it is also possible that the light-emitting branch 11 includes only one driving transistor and one switching transistor.

The pixel driving circuit provided by the present disclosure generates the drive current under the control of the pulse amplitude modulation circuit 10 and the pulse width modulation circuit 20, and provides the drive current to the light-emitting element LD. The pulse amplitude modulation circuit 10 can be configured to control the amplitude of the drive current. The pulse width modulation circuit 20 can be configured to adjust the pulse width of the drive current applied to the light-emitting element LD. The pulse width modulation circuit 20 is configured to adjust a pulse width of a voltage applied to the light-emitting element LD. That is, the pulse width modulation circuit 20 adjusts an actual emission period during which the drive current is applied to the light-emitting element LD. Meanwhile, the drive current applied to the light-emitting element LD can be kept at a constant level to adjust a gray-scale or brightness displayed by the light-emitting element LD instead of adjusting the gray-scale or brightness displayed by the light-emitting element LD by adjusting the magnitude of the drive current applied to the light-emitting element LD. Therefore, the pulse amplitude modulation circuit 10 can provide the drive current to the light-emitting element LD so that the light-emitting element LD is driven at an optimal light-emitting efficiency, and the gray-scale or brightness displayed by the light-emitting element LD can be adjusted by adjusting a light-emitting duty ratio of the light-emitting element LD (i.e., the emission period of the light-emitting element LD) through the pulse width modulation circuit 20.

Figure 3:
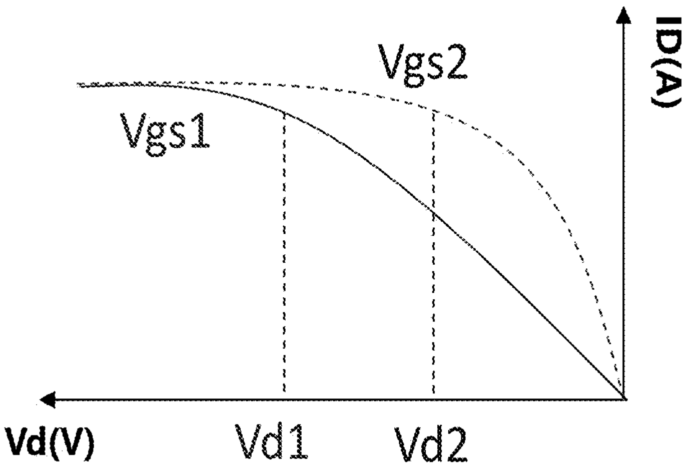
FIG. 3 is a comparison diagram of output currents of a single-gate transistor and a double-gate double-channel transistor.

In the light-emitting phase, the drive current provided by the pulse amplitude modulation circuit 10 to the light-emitting element LD is transmitted to the light-emitting element LD through the light-emitting branch 11. Taking the structure shown in FIG. 2 as an example, the light-emitting branch 11 includes the first driving transistor M0 and the switching transistors, and the drive current is transmitted to the light-emitting element LD through the first driving transistor M0 and the switching transistors. Where the light-emitting element LD is a light-emitting diode, such as a mini LED, micro LED, or the like, the drive current required for driving the light-emitting element LD is larger. In related arts, where a common transistor is used as the driving transistor or the switching transistor, the common transistor, such as a transistor with a single gate, has insufficient capability to output a current, and requires higher Vgs and Vds voltages to reach the drive current required by the light-emitting diode, and thus the power consumption is caused to increase. FIG. 3 is a comparison diagram of output currents of a transistor with a single-gate structure and a double-gate double-channel transistor, where Vd1 and Vgs1 represent a drain voltage and a gate-source voltage corresponding to the single-gate transistor, respectively, Vd2 and Vgs2 represent a drain voltage and a gate-source voltage corresponding to the double-gate double-channel transistor, respectively, ID represents the drive current which is output, and Vd represents a drain voltage. In order to achieve the same magnitude of the drive current, in the single-gate transistor and the double-gate double-channel transistor, Vgs1>Vgs2, |Vd1|>|Vd2|. The power consumption of a transistor is P=ID×|Vd|, and where the value of the drive current ID is constant, the larger |Vd| is, the higher the power consumption is, and conversely, the smaller the |Vd| is, the lower the power consumption is. Since |Vd1|>|Vd2|, in order to achieve the same drive current, the power consumption of the double-gate double-channel transistor is smaller. To this end, in the embodiments of the present disclosure, at least one of the driving transistor and the switching transistors in the light-emitting branch 11 is provided as a double-gate double-channel transistor. Compared with the common transistor, the double-gate double-channel transistor has two gates and two channels. When transmitting in the light-emitting branch, the drive current may pass through the channel regions of the transistor. When the double-gate double-channel transistor is employed, this is equivalent to increasing the output channel for the drive current, reducing the transmission time of the drive current, being conducive to improving the transmission efficiency of the drive current, and reducing the power consumption of the pixel driving circuit. Moreover, increasing the output channel for the drive current is also conducive to increasing the output current, thereby improving the brightness of the light-emitting element. When the pixel driving circuit is used in a display product, it is conducive to improving the overall brightness of the display product.

Figure 4:
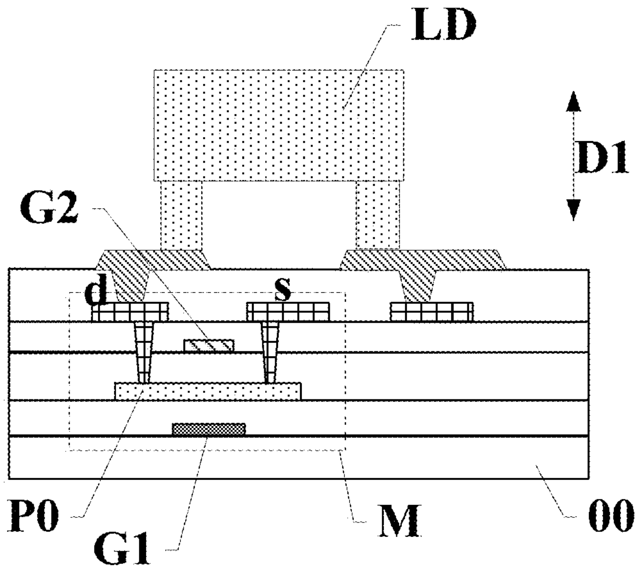
FIG. 4 is a schematic diagram of a connection between a light-emitting element and a double-gate double-channel transistor provided by an embodiment of the present disclosure.
Figure 5:
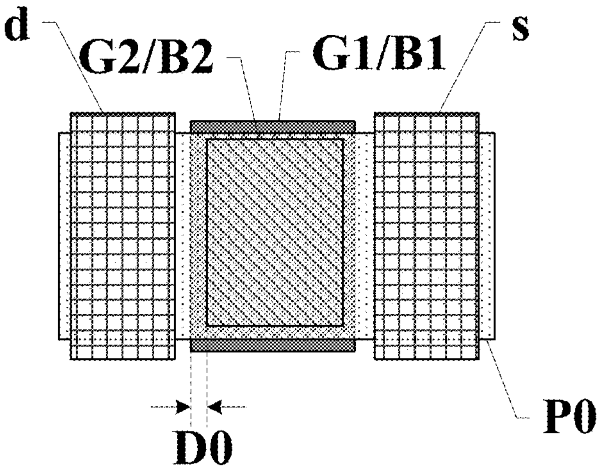
FIG. 5 is a first top view of the double-gate double-channel transistor provided by an embodiment of the present disclosure.

FIG. 4 is a schematic diagram of a connection between a light-emitting element LD and a double-gate double-channel transistor M provided by an embodiment of the present disclosure. FIG. 5 is a first top view of the double-gate double-channel transistor provided by the embodiment of the present disclosure. Referring to FIG. 4 and FIG. 5, in an optional implementation of the present disclosure, the double-gate double-channel transistor includes a substrate 00 and an active layer P0, a bottom gate G1 and a top gate G2 that are located on the same side of the substrate 00. In a first direction, the bottom gate G1 and the top gate G2 are respectively located on two sides of the active layer P0, the bottom gate G1 is located between the active layer P0 and the substrate 00, and the first direction D1 is perpendicular to a plane where the substrate 00 is located. Optionally, a source s and a drain d of the double-gate double-channel transistor are located on a side of the top gate G2 away from the substrate 00. An outer edge of an orthographic projection of the bottom gate G1 on a plane where the active layer P0 is located is a first edge B1, an outer edge of an orthographic projection of the top gate G2 on the plane where the active layer P0 is located is a second edge B2, and the first edge B1 is peripheral to the second edge B2.

With continued reference to FIG. 4 and FIG. 5, for the double-gate double-channel transistor, it has two gates and two channels, the two gates are the top gate G2 and the bottom gate G1, and the top gate G2 is located on a side of the active layer P0 facing away from the substrate and the bottom gate G1 is located on a side of the active layer P0 facing the substrate. In the first direction, a region formed by overlapping the top gate G2 and the active layer P0 is a first channel of the transistor, and a region formed by overlapping the bottom gate G1 and the active layer P0 forms a second channel of the transistor. The first channel and the second channel overlap in the first direction to form a double-channel structure. When the double-gate double-channel transistor is turned on, the drive current is transmitted to the light-emitting element LD through the first channel and the second channel respectively, and thus this is equivalent to increasing the transmission channel of the drive current, which is conducive to reducing the power consumption. In this embodiment, "an outer edge of an orthographic projection of the bottom gate G1 on a plane where the active layer P0 is located is a first edge B1, an outer edge of an orthographic projection of the top gate G2 on the plane where the active layer P0 is located is a second edge B2, and the first edge B1 is peripheral to the second edge B2" means that an area of the orthographic projection of the bottom gate G1 on the plane where the active layer P0 is located is greater than an area of the orthographic projection of the top gate G2 on the plane where the active layer P0 is located, and the orthographic projection of the top gate G2 on the plane where the active layer P0 is located is within the range of the orthographic projection of the bottom gate G1 on the plane where the active layer P0 is located. In this way, it is conducive to avoiding the misalignment between the top gate G2 and the bottom gate G1, to ensure the double-gate and double-channel structure of the transistor.

Optionally, in the aforementioned embodiment, a distance between the first edge corresponding to the bottom gate G1 and the second edge corresponding to the top gate G2 is D0, where D0≥1 μm. That is to say, the first edge B1 of the orthographic projection of the bottom gate G1 on the plane where the active layer P0 is located is expanded outward by at least 1 μm relative to the second edge B2 of the orthographic projection of the top gate G2 on the plane where the active layer P0 is located. As such, even considering the alignment deviation during the manufacturing process, it is possible to guarantee the overlapping area between the bottom gate G1 and the top gate G2 and ensure the double-gate and double-channel structure of the transistor.

The structure of the double-gate double-channel transistor mentioned in the embodiment of the present disclosure may refer to FIG. 4 and FIG. 5, and the repetition will not be repeated again.

It should be noted that the embodiment shown in FIG. 2 shows only a solution in which the driving transistor in the light-emitting branch 11 is a double-gate double-channel transistor, and in some other embodiments of the present disclosure, other transistors in the light-emitting branch 11 may also be provided with the double-gate double-channel structure. For example, referring to FIG. 6 and FIG. 7, which respectively show other structural schematic diagrams of the pixel driving circuits provided by embodiments of the present disclosure, refine a part of a structure of the pulse amplitude modulation circuit 10, and differ from FIG. 2 in that the number of the double-gate double-channel transistors in the light-emitting branch 11 is increased. In the embodiment shown in FIG. 6, the switching transistors in the light-emitting branch 11 include the first switching transistor M1 and the second switching transistor M2. The first driving transistor M0 is connected in series between the first switching transistor M1 and the second switching transistor M2. A gate of the first switching transistor M1 is connected to a first switching control terminal EM1, a gate of the second switching transistor M2 is connected to a second switching control terminal EM2, and the second switching transistor M2 is connected in series between the first driving transistor M0 and the light-emitting element LD. The first switching transistor M1, the first driving transistor M0, and the second switching transistor M2 are all double-gate double-channel transistors. Here, each of the transistors in the light-emitting branch 11 is a double-gate double-channel transistor and has two channels. In the light-emitting phase, when passing through each of the transistors, the drive current passes through the two channels of each of the transistors, thereby effectively increasing the transmission rate of the drive current and being conducive to increasing the output current, and thus being more conducive to reducing the power consumption of the pixel driving circuit.

Figure 6:
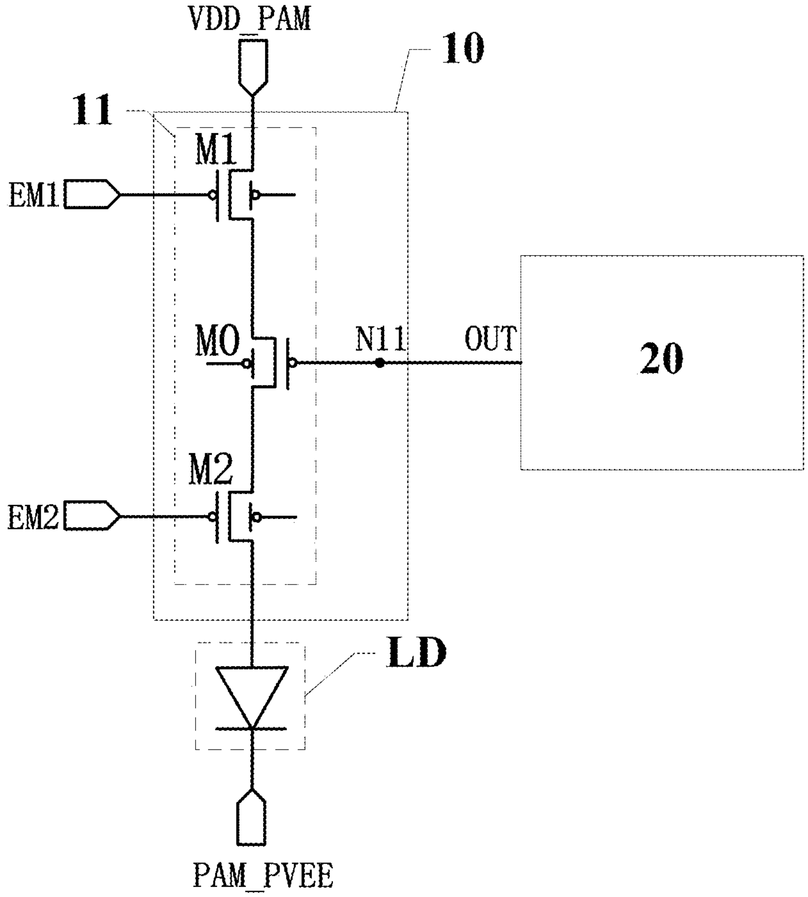
FIG. 6 is another structural schematic diagram of a pixel driving circuit provided by an embodiment of the present disclosure.
Figure 7:
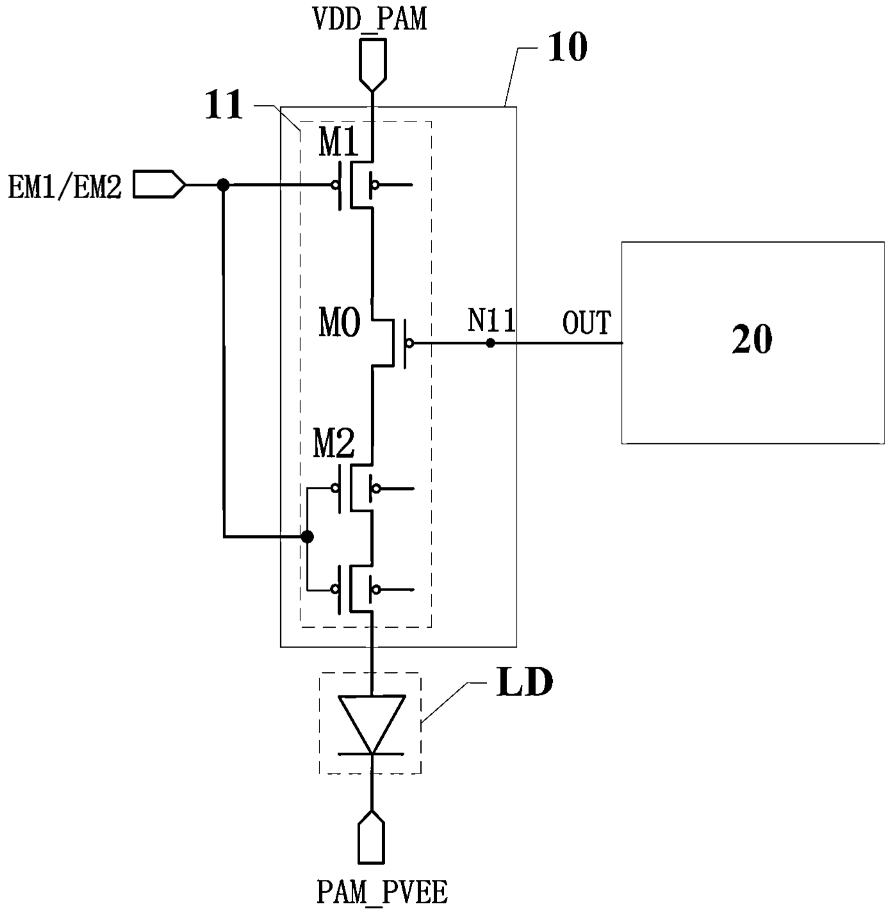
FIG. 7 is another structural schematic diagram of a pixel driving circuit provided by an embodiment of the present disclosure.

The embodiment shown in FIG. 7 differs from the embodiment shown in FIG. 6 in that the second switching transistor M2 is of a different type. Referring to FIG. 7, in the light-emitting branch 11, the switching transistors include a first switching transistor M1 and a second switching transistor M2. The first driving transistor M0 is connected in series between the first switching transistor M1 and the second switching transistor M2. A gate of the first switching transistor M1 is connected to a first switching control terminal EM1, a gate of the second switching transistor M2 is connected to a second switching control terminal EM2, and the second switching transistor M2 is connected in series between the first driving transistor M0 and the light-emitting element LD. The first driving transistor M0 and the first switching transistor M1 are double-gate double-channel transistors. The second switching transistor M2 is a four-gate four-channel transistor.

Specifically, the embodiment shown in FIG. 7 illustrates another feasible implementation of the light-emitting branch 11. Similar to the embodiment shown in FIG. 6, the light-emitting branch 11 includes a first driving transistor M0 and two switching transistors, the first switching transistor M1 is connected in series between a first power supply voltage terminal VDD_PAM and the first driving transistor M0, and the second switching transistor M2 is connected in series between the light-emitting element LD and the first driving transistor M0. In the light-emitting branch 11, the second switching transistor M2 disposed close to the light-emitting element LD is a four-gate four-channel transistor. The first driving transistor M0 and the first switching transistor M1 are double-gate double-channel transistors. The four-gate four-channel transistor may be regarded as a series connection of two double-gate double-channel transistors, which further increases the number of channels compared with a double-gate double-channel transistor, which is equivalent to a further increase in the current transmission path. As the second switching transistor M2 is closer to the light-emitting element LD than the first driving transistor M0, the four-gate four-channel second switching transistor M2 can further improve the transmission rate of the drive current, reduce the transmission time of the drive current, further improve the capability of the pixel driving circuit to output the drive current, and thus be more conducive to reducing the power consumption of the circuit. In addition, in this embodiment, both the first switching transistor M1 and the first driving transistor M0 are double-gate double-channel transistors, and the second switching transistor M2 is a four-gate four-channel transistor. Compared to single-gate transistors, the number of the current output channels is increased, so that the output power consumption of the first driving transistor M0, the first switching transistor M1, and the second switching transistor M2 is effectively reduced, thus being conducive to reducing the overall power consumption of the pixel driving circuit.

With continued reference to FIG. 6 and FIG. 7, in an optional implementation of the present disclosure, a width-to-length ratio of the second switching transistor M2 is greater than a width-to-length ratio of the first switching transistor M1.

It should be noted that for the double-gate double-channel transistor, as described above with reference to FIG. 4, the top gate G2 and the bottom gate G1 overlap in the first direction D1, the two channels also overlap. The width-to-length ratio of the double-gate double-channel transistor may be regarded as the width-to-length ratio of one of the channels. For example, the width-to-length ratio of the channel formed by overlapping the top gate G2 of the double-gate double-channel transistor and the active layer P0 may be used as the width-to-length ratio of the double-gate double-channel transistor. For the four-gate four-channel transistor, the width-to-length ratio thereof may be regarded as a sum of the width-to-length ratios of two double-gate double-channel transistors therein.

With continued reference to FIG. 6 and FIG. 7, where the light-emitting branch 11 includes both the first switching transistor M1 and the second switching transistor M2, the first switching transistor M1 is connected in series between the first driving transistor M0 and the first power supply voltage terminal VDD_PAM, and the second switching transistor M2 is connected in series between the first driving transistor M0 and the light-emitting element LD. That is, the second switching transistor M2 is closer to the light-emitting element LD than the first switching transistor M1. Since the driving capability of a transistor is positively correlated with the width-to-length ratio thereof, the larger the width-to-length ratio is, the stronger the driving capability is, and the stronger the capability to output current is. In this embodiment, where the width-to-length ratio of the second switching transistor M2 closer to the light-emitting element LD is set to be larger, this is conducive to increasing the capability to output current of the transistor closer to the light-emitting element LD, thereby enabling the required drive current to be output to the light-emitting element LD in a shorter time, which is conducive to improving the overall capability to output current of the pixel driving circuit, and also is conducive to reducing the overall power consumption of the pixel driving circuit.

With continued reference to FIG. 6 and FIG. 7, where the width-to-length ratio of the second switching transistor M2 is greater than the width-to-length ratio of the first switching transistor M1, optionally, the width-to-length ratio of the first switching transistor M1 is A1, and the width-to-length ratio of the second switching transistor M2 is A2, $A2=K\times A1$, and $K\geq 2$.

Figure 8:
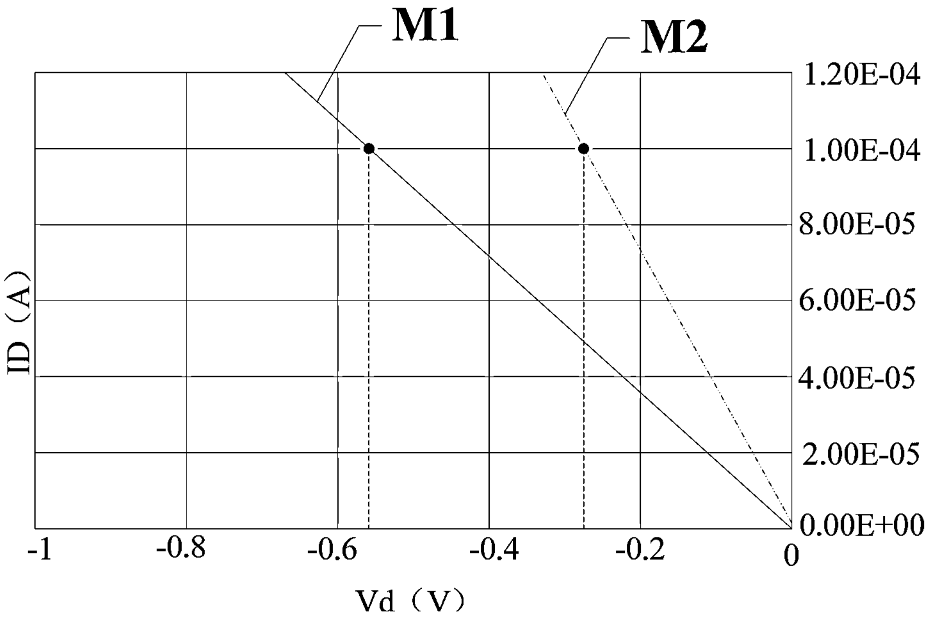
FIG. 8 is a relationship diagram of drive currents and drain voltages corresponding to transistors with different width-to-length ratios.

FIG. 8 is a relationship diagram of drive currents and drain voltages corresponding to transistors with different width-to-length ratios, which is illustrated by taking A1=45 μm/4 μm and A2=90 μm/4 μm as an example. Here, K=2. That is, the width-to-length ratio of the second switching transistor M2 is twice the width-to-length ratio of the first switching transistor M1. With continued reference to FIG. 8, when the drive current reaches 1.00E-04, the Vd corresponding to the first switching transistor M1 is about −0.55 V, and the Vd corresponding to the second switching transistor M2 is about −0.25 V. That is, in order to reach the same drive current, the absolute value of the Vd of the second switching transistor M2 is smaller. Considering that the power consumption of a transistor $P=ID\times|Vd|$, the smaller

|Vd| is, the smaller the corresponding power consumption is, and thus the power consumption of the second switching transistor M2 will be smaller. When K=2, the power consumption of the second switching transistor M2 can be reduced by at least 50% compared with the first switching transistor M1, and when K>2, the power consumption of the second switching transistor M2 can be reduced by 50% or more compared with the first switching transistor M1. Therefore, in this embodiment, where the width-to-length ratio of the second switching transistor M2 is set to be 2 or more times than the width-to-length ratio of the first switching transistor M1, the power consumption of the second switching transistor M2 can be effectively reduced. Meanwhile, since the width-to-length ratio of a transistor is positively correlated with the capability to output current thereof, where the width-to-length ratio of the second switching transistor M2 is set to be 2 times or more than the width-to-length ratio of the first switching transistor M1, this is conducive to greatly improving the capability of the second switching transistor M2 to output the drive current to the light-emitting element LD, thereby improving the overall capability of the pixel driving circuit to output the drive current to the light-emitting element LD.

Referring to FIG. 7, in an optional implementation of the present disclosure, the first switching control terminal EM1 and the second switching control terminal EM2 are the same switching control terminal. This embodiment shows a solution in which the gate of the first switching transistor M1 and the gate of the second switching transistor M2 are connected to the same switching control terminal in the light-emitting branch 11. In the light-emitting phase, the first switching transistor M1 and the second switching transistor M2 are simultaneously turned on under the control of the switching control terminal, which is conducive to reducing the number of the switching control terminals connected to the switching transistors and simplifying the circuit structure of the pixel driving circuit.

Certainly, in some other embodiments of the present disclosure, the first switching control terminal EM1 corresponding to the first switching transistor M1 and the second switching control terminal EM2 corresponding to the second switching transistor M2 may also be embodied as different control terminals as required, and the two different control terminals only need to control both the first switching transistor M1 and the second switching transistor M2 to be turned on in the light-emitting phase.

Figure 9:
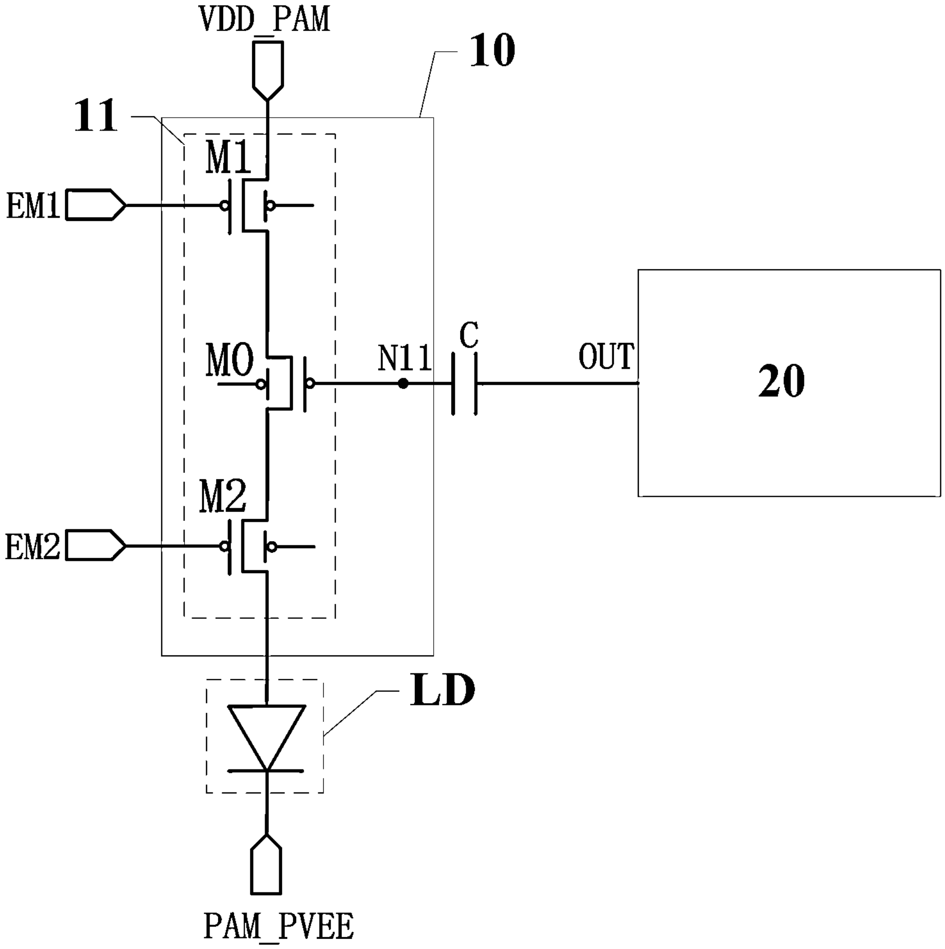
FIG. 9 is another structural schematic diagram of a pixel driving circuit provided by an embodiment of the present disclosure.

In an optional implementation of the present disclosure, referring to FIG. 2, FIG. 6, and FIG. 7, the output terminal OUT of the pulse width modulation circuit 20 is connected to the gate of the first driving transistor M0, or, referring to FIG. 9, the output terminal OUT of the pulse width modulation circuit 20 is connected to the gate of the first driving transistor M0 through a capacitor C. FIG. 9 is another structural schematic diagram of a pixel driving circuit provided by an embodiment of the present disclosure.

Referring to FIG. 2, FIG. 6, and FIG. 7, where the output terminal OUT of the pulse width modulation circuit 20 is directly connected to the gate of the first driving transistor M0 in the pulse amplitude modulation circuit 10, the signal from the output terminal of the pulse width modulation circuit 20 directly acts on the gate of the first driving transistor M0 in the pulse amplitude modulation circuit 10. In this way, the change of the potential of the gate of the first driving transistor M0 can be directly controlled through the signal from the output terminal of the pulse width modulation circuit 20, thereby achieving control of the cutoff state of the first driving transistor M0, thereby modulating the pulse width of the drive current output from the pulse amplitude modulation circuit 10 to the light-emitting element LD.

Referring to FIG. 9, where the output terminal OUT of the pulse width modulation circuit 20 is connected to the gate of the first driving transistor M0 through the capacitor C, it is assumed that of the two plates of the capacitor C, the plate connected to the pulse width modulation circuit 20 is a first plate, and the plate connected to the pulse amplitude modulation circuit 10 is a second plate. The control current provided by the output terminal of the pulse width modulation circuit 20 causes the voltage of the first plate of the capacitor to change by ΔV, and thus the voltage of the second plate of the capacitor also changes by ΔV accordingly. Through the coupling effect of the capacitor, the gate voltage of the first driving transistor M0 in the pulse amplitude modulation circuit 10 changes by ΔV, and the first driving transistor M0 can be controlled to be turned off, causing the pulse amplitude modulation circuit 10 to stop providing the drive current to the light-emitting element LD, thereby achieving the control of the flow period of the drive current. By way of introducing the capacitor, there is no direct correlation between the gate voltage of the first driving transistor M0 in the pulse amplitude modulation circuit 10 and the control current provided by the pulse width modulation circuit 20, so that the turn-off of the driving transistor can be controlled more accurately, which is conducive to improving the performance stability of the pixel driving circuit. Moreover, there is no necessary magnitude relationship between the voltage value of the output terminal signal of the pulse width modulation circuit 20 and the source voltage of the first driving transistor M0, which can reduce the correlation degree between the signal required for the operation of the pulse amplitude modulation circuit 10 and the signal required for the operation of the pulse width modulation circuit 20.

Figure 10:
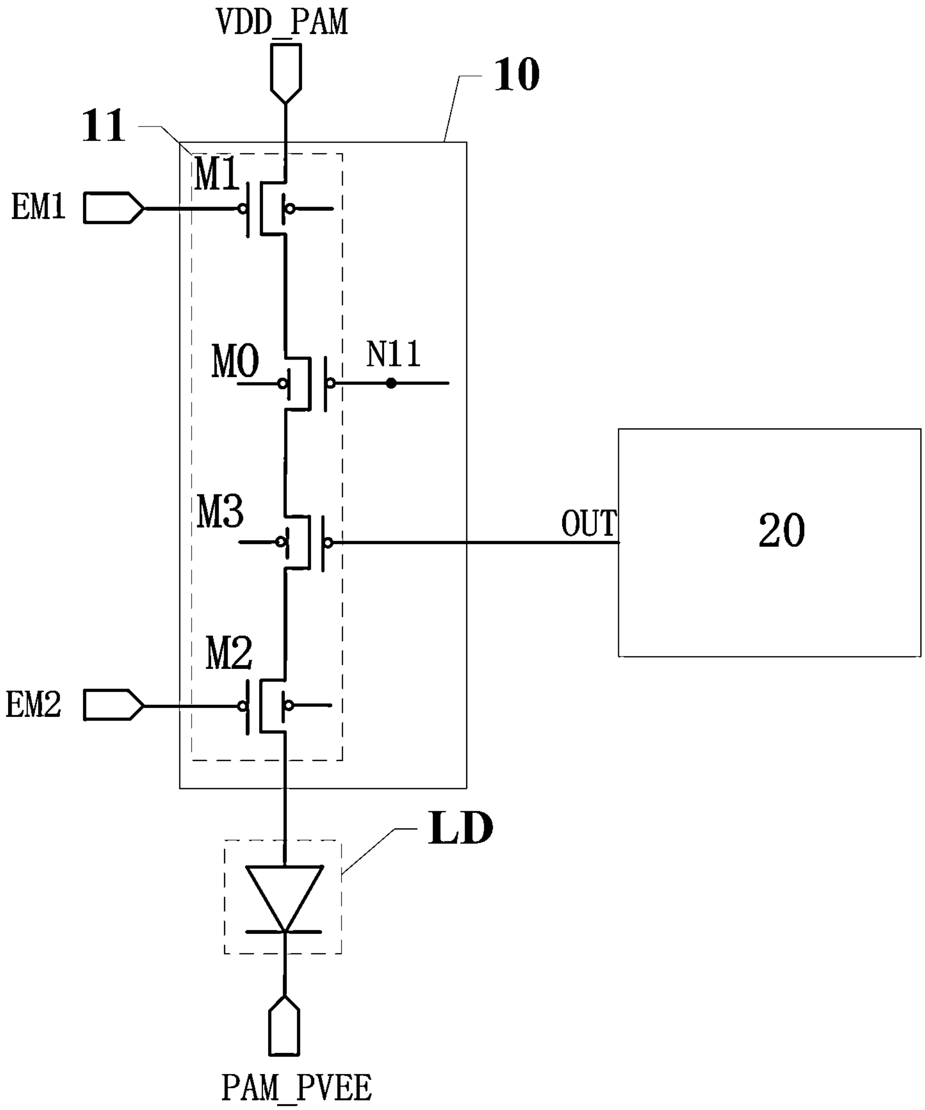
FIG. 10 is another structural schematic diagram of a pixel driving circuit provided by an embodiment of the present disclosure.

FIG. 10 is another structural schematic diagram of a pixel driving circuit provided by an embodiment of the present disclosure. In an optional implementation of the present disclosure, the light-emitting branch 11 further includes a third transistor M3 connected in series between the first driving transistor M0 and the light-emitting element LD. A gate of the third transistor M3 is connected to the output terminal OUT of the pulse width modulation circuit 20.

This embodiment shows a solution in which the third transistor M3 is introduced into the light-emitting branch 11, and takes the third transistor M3 being connected in series between the first driving transistor M0 and the second switching transistor M2 as an example for illustration. In the light-emitting phase, the first switching transistor M1, the first driving transistor M0, the second switching transistor M2, and the third transistor M3 in the light-emitting branch 11 are all turned on, and the drive current is transmitted to the light-emitting element LD through the light-emitting branch 11. In this embodiment, the output terminal OUT of the pulse width modulation circuit 20 is connected to the gate of the third transistor M3, and the change of the potential of the gate of the third transistor M3 is controlled by the output signal of the pulse width modulation circuit 20, thereby achieving the control of the turn-off state of the third transistor M3, thereby realizing the modulation of the pulse width of the drive current output from the pulse amplitude modulation circuit 10 to the light-emitting element LD.

With continued reference to FIG. 10, in an optional implementation of the present disclosure, the third transistor M3 is connected in series between the first driving transistor M0 and the second switching transistor M2; and a width-to-length ratio of the third transistor M3 is A3, the width-to-length ratio of the first switching transistor M1 is A1, and the width-to-length ratio of the second switching transistor M2 is A2, where A1<A3<A2.

Where the third transistor M3 is introduced into the light-emitting branch 11 and connected in series between the first driving transistor M0 and the second switching transistor M2, among the first switching transistor M1, the third transistor M3, and the second switching transistor M2, the transistor directly connected to the light-emitting element LD is the second switching transistor M2. In the flow direction of the drive current in the light-emitting branch 11, the first switching transistor M1 is farther from the light-emitting element LD, and the third transistor M3 is located between the first switching transistor M1 and the second switching transistor M2. In this embodiment, the width-to-length ratio relationship among the three is set to be A1<A3<A2, which is equivalent to setting the width-to-length ratio A2 of the second switching transistor M2 closest to the light-emitting element LD in the light-emitting branch 11 to be the largest, setting the width-to-length ratio A1 of the first switching transistor M1 farthest from the light-emitting element LD to be the smallest, and setting the width-to-length ratio A3 of the third transistor M3 to be intermediate, which effectively increases the capability of the second switching transistor M2 directly connected to the light-emitting element LD to output the drive current. The closer to the light-emitting element LD, the larger the width-to-length ratio is, and thus the more conducive to improving the transmission efficiency of the drive current and reducing the power consumption of the pixel driving circuit.

With continued reference to FIG. 10, optionally, the third transistor M3 is a double-gate double-channel transistor. Where the third transistor M3 is introduced between the first driving transistor M0 and the second switching transistor M2 in the light-emitting branch 11, and where the third transistor M3 is provided as a double-gate double-channel transistor, the third transistor M3 has two current transmission channels. When passing through the third transistor M3, the drive current may pass through the two channels of the third transistor M3, thereby effectively increasing the transmission rate of the drive current and being conducive to increasing the output current, and thus more conducive to reducing the power consumption of the pixel driving circuit.

As an optional embodiment, in FIG. 10, the first switching transistor M1, the first driving transistor M0, the third transistor M3, and the second switching transistor M2 are all double-gate double-channel transistors.

As another optional embodiment, the second switching transistor M2 in FIG. 10 may also be provided as a four-gate four-channel transistor, and the first switching transistor M1, the first driving transistor M0, and the third transistor M3 may be maintained as double-gate double-channel transistors.

Figure 11:
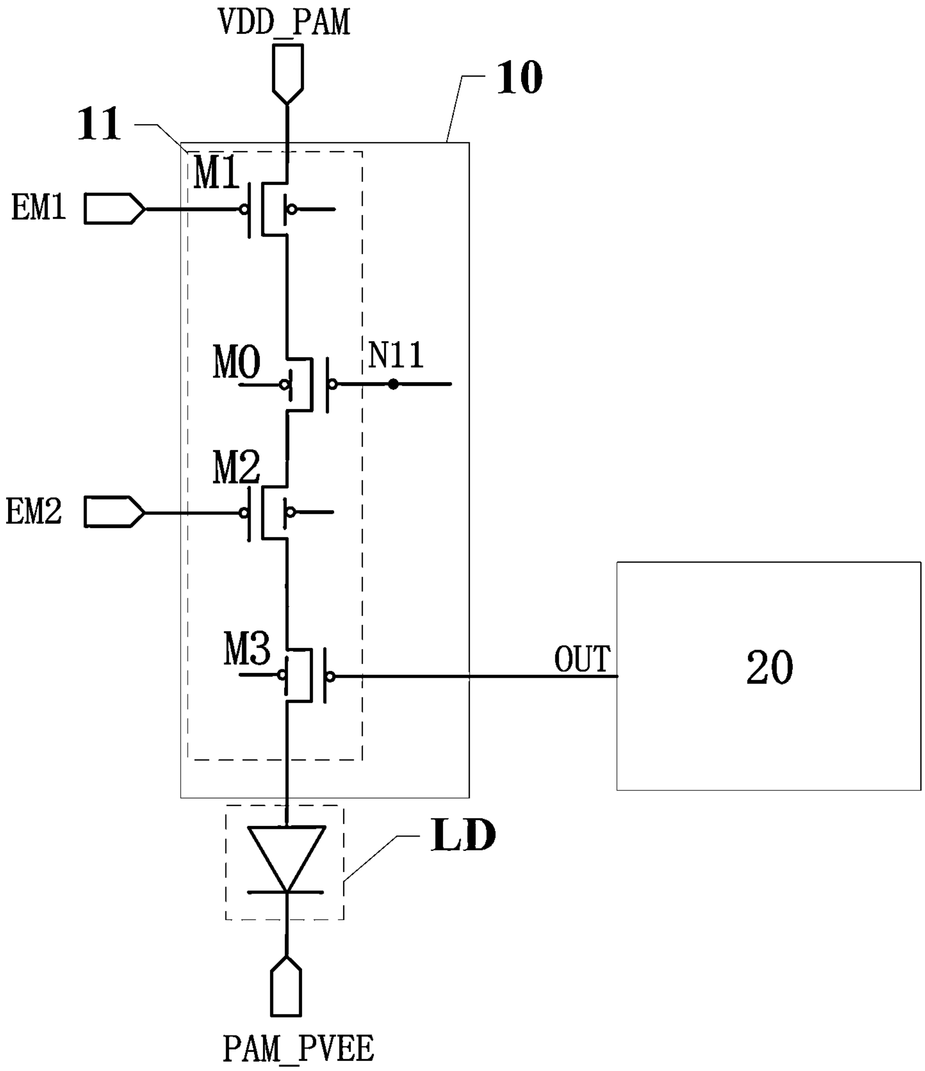
FIG. 11 is another structural schematic diagram of a pixel driving circuit provided by an embodiment of the present disclosure.

FIG. 11 is another structural schematic diagram of a pixel driving circuit provided by an embodiment of the present disclosure. Referring to FIG. 11, in an optional implementation of the present disclosure, a third transistor M3 is connected in series between the second switching transistor M2 and the light-emitting element LD, a width-to-length ratio of the third transistor M3 is A3, the width-to-length ratio of the first switching transistor M1 is A1, and the width-to-length ratio of the second switching transistor M2 is A2, where A1<A2<A3.

This embodiment shows another feasible connection manner where the third transistor M3 is introduced into the light-emitting branch 11. Specifically, the third transistor M3 is connected in series between the second switching transistor M2 and the light-emitting element LD, and the transistor directly connected to the light-emitting element LD is the third transistor M3. In the light-emitting branch 11, in the flow direction of the drive current in the light-emitting branch 11, the third transistor M3 is closest to the light-emitting element LD, the first switching transistor M1 is farthest from the light-emitting element LD, and the second switching transistor M2 is located between the first switching transistor M1 and the third transistor M3. Here, the width-to-length ratio relationship among the foregoing three transistors is A1<A2<A3, which is equivalent to setting the width-to-length ratio A3 of the third transistor M3 closest to the light-emitting element LD in the light-emitting branch 11 to be the largest, setting the width-to-length ratio A1 of the first switching transistor M1 farthest from the light-emitting element LD to be the smallest, and setting the width-to-length ratio A2 of the second switching transistor M2 to be intermediate, which effectively increases the capability of the third transistor M3 directly connected to the light-emitting element LD to output the drive current. The closer to the light-emitting element LD, the larger the width-to-length ratio is, and thus the more conducive to improving the transmission efficiency of the drive current and reducing the power consumption of the pixel driving circuit.

Optionally, in the light-emitting branch 11 of the present embodiment, the first switching transistor M1, the first driving transistor M0, the second switching transistor M2, and the third transistor M3 are all double-gate double-channel transistors. In this way, when transmitting the drive current, each of the transistors in the light-emitting branch 11 has two current transmission channels, thereby being more conducive to improving the transmission rate of the drive current in the light-emitting branch 11 and reducing the overall power consumption of the pixel driving circuit.

Figure 12:
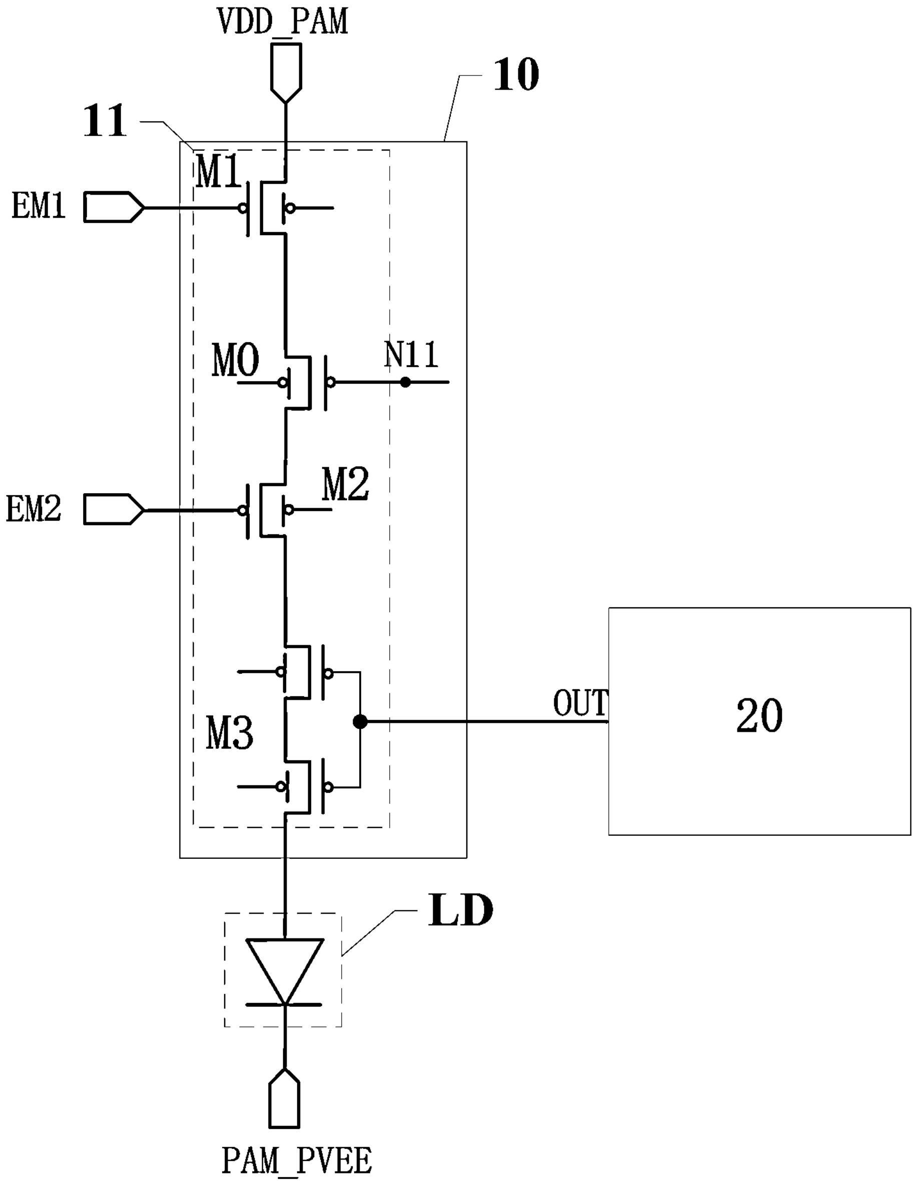
FIG. 12 is another structural schematic diagram of a pixel driving circuit provided by an embodiment of the present disclosure.

FIG. 12 is another structural schematic diagram of a pixel driving circuit provided by an embodiment of the present disclosure. Referring to FIG. 12, in an optional implementation of the present disclosure, the third transistor M3 is a four-gate four-channel transistor.

The light-emitting branch 11 of the present embodiment differs from the embodiment shown in FIG. 11 in that the type of the third transistor M3 is different, while others are the same, and the width-to-length ratio relationship also satisfies A1<A2<A3. Where the third transistor M3 is provided as a four-gate four-channel transistor, the third transistor M3 directly connected to the light-emitting element LD in the light-emitting branch 11 has four channels, which can simultaneously transmit the drive current, thereby further increasing the capability of the third transistor M3 to output the current to the light-emitting element LD, and thus being conducive to further reducing the overall power consumption of pixel driving.

Figure 13:
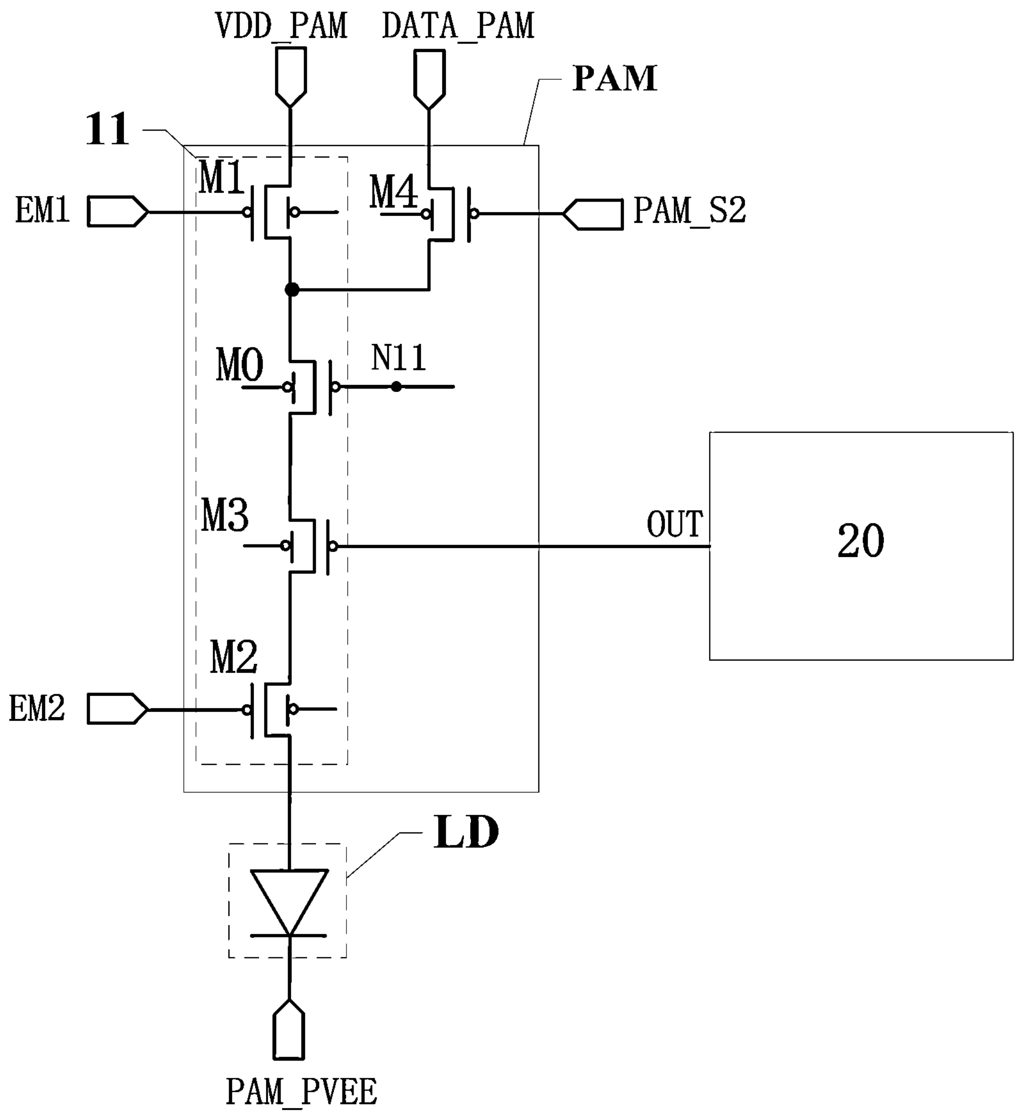
FIG. 13 is another structural schematic diagram of a pixel driving circuit provided by an embodiment of the present disclosure.

FIG. 13 is another structural schematic diagram of a pixel driving circuit provided by an embodiment of the present disclosure. Referring to FIG. 13, in an optional implementation of the present disclosure, the pulse amplitude modulation circuit 10 further includes a first data writing transistor M4 connected in series between the first data signal terminal DATA_PAM and a first electrode of the first driving transistor M0, and the first electrode of the first driving transistor M0 is connected to the first switching transistor M1; and the first data writing transistor M4 is a double-gate double-channel transistor.

This embodiment shows a solution in which the first data writing transistor M4 is introduced into the pulse amplitude modulation circuit 10. The first data writing transistor M4 is configured to transmit a data signal from the first data signal terminal DATA_PAM to the first driving transistor M0 in a data writing phase of the pulse amplitude modulation circuit 10. Generally, the drive current for driving the light-emitting element LD to emit light is related to the data signal. Whether the light-emitting element LD can emit light according to the preset brightness or not is closely related to the accuracy of the voltage corresponding to the data signal. In the embodiment of the present disclosure, where the first data writing transistor M4 is provided as a double-gate double-channel transistor, in the data writing phase, the data signal may be transmitted through the two channels of the first data writing transistor M4, thereby being conducive to improving the transmission rate of the data signal, reducing the voltage drop of the data signal, and thus improving the accuracy of the data signal received by the pixel driving circuit.

It should be noted that in addition to the first data writing transistor M4 and the plurality of transistors in the light-emitting branch 11, the pulse amplitude modulation circuit 10 may further include some other units, for example, a threshold compensation unit, an initialization unit and so on, which will be described in subsequent embodiments.

Figure 14:
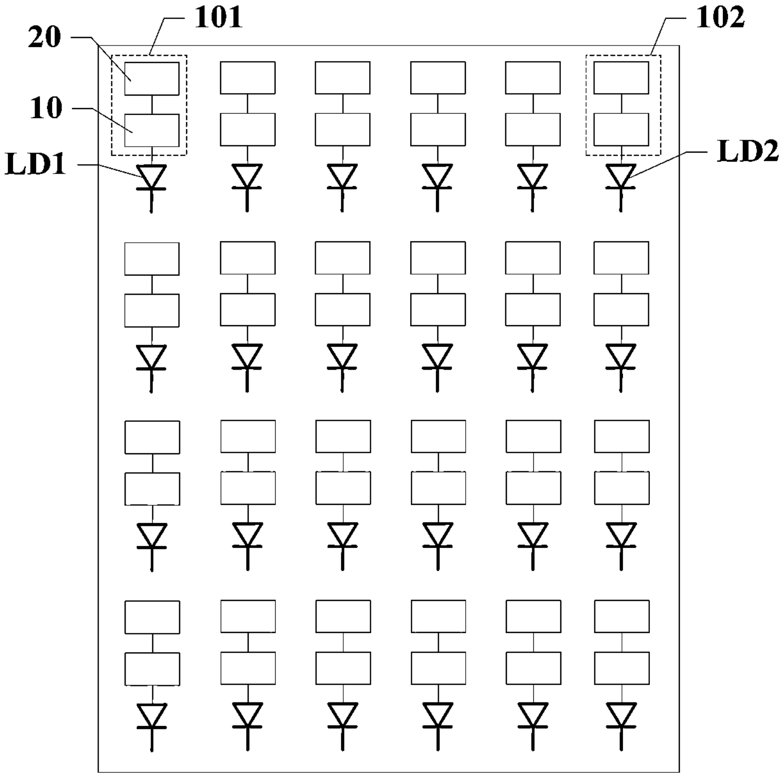
FIG. 14 is a schematic diagram of a connection between a pixel driving circuit and a light-emitting element in the present disclosure.

FIG. 14 is a schematic diagram of a connection between a pixel driving circuit and a light-emitting element LD in the present disclosure. In an optional implementation of the present disclosure, the pixel driving circuit includes a first pixel driving circuit 101 and a second pixel driving circuit 102. The first pixel driving circuit 101 is configured to be electrically connected to a first color light-emitting element LD1. The second pixel driving circuit 102 is configured to be electrically connected to a second color light-emitting element LD2. A light-emitting efficiency of the first color light-emitting element LD1 is less than a light-emitting efficiency of the second color light-emitting element LD2. In conjunction with FIG. 6 and FIG. 7, in the first pixel driving circuit 101, the width-to-length ratio of the first switching transistor M1 is A11, and the width-to-length ratio of the second switching transistor M2 is A21. In the second pixel driving circuit 102, the width-to-length ratio of the first switching transistor M1 is A12, and the width-to-length ratio of the second switching transistor M2 is A22; where A11>A12, and/or A21>A22.

It should be noted that in the embodiment shown in FIG. 14, the first pixel driving circuit 101 and the second pixel driving circuit 102 each may adopt the structure of the pixel driving circuit in any one of the foregoing embodiments, which is not specifically limited in the present disclosure. Optionally, the first pixel driving circuit 101 and the second pixel driving circuit 102 adopt the same circuit structure, for example, in the light-emitting branch 11 corresponding to the first pixel driving circuit 101 and the light-emitting branch 11 corresponding to the second pixel driving circuit 102, the number of the transistors included therein are the same, the connection relationships thereof are the same, and the connection relationships between the light-emitting branches 11 and the pulse width modulation circuits 20 are also the same. The difference is that some of the transistors in the light-emitting branches 11 have different width-to-length ratios, and the light-emitting colors of the light-emitting elements LD connected to the light-emitting branches 11 are different.

In this embodiment, the first pixel driving circuit 101 is connected to the first color light-emitting element LD1, the second pixel driving circuit 102 is connected to the second color light-emitting element LD2, and the light-emitting efficiency of the second color light-emitting element LD2 is higher than the light-emitting efficiency of the first color light-emitting element LD1. That is, in order to achieve the same brightness, the drive current required by the first color light-emitting element LD1 is greater than the drive current required by the second color light-emitting element LD2.

To this end, a first feasible implementation is to: set the width-to-length ratio A11 of the first switching transistor M1 corresponding to the first pixel driving circuit 101 to be greater than the width-to-length ratio A12 of the first switching transistor M1 corresponding to the second pixel driving circuit 102, and at the same time set the width-to-length ratio A21 of the second switching transistor M2 corresponding to the first driving circuit to be equal to the width-to-length ratio A22 of the second switching transistor M2 corresponding to the second pixel driving transistor circuit, which is equivalent to improving the capability of the light-emitting branch 11 corresponding to the first driving circuit to output the drive current, which is conducive to increasing the drive current output by the first driving circuit to improve the light-emitting brightness of the first color light-emitting element LD1 with a lower light-efficiency, which is conducive to balancing the difference between the light-emitting brightness of the first color light-emitting element LD1 and the light-emitting brightness of the second color light-emitting element LD2 and improving the display brightness uniformity. Optionally, $A11=K1\times A12$, and $K1\geq 1.5$. The inventors have found upon research that when $K1<1.5$, the drive current output by the light-emitting branch 11 is not significantly improved, and when $K1\geq 1.5$, the drive current output by the first pixel driving circuit can be effectively increased.

A second feasible implementation is to: set the width-to-length ratio A21 of the second switching transistor M2 corresponding to the first pixel driving circuit 101 be greater than the width-to-length ratio A22 of the second switching transistor M2 corresponding to the second pixel driving circuit 102, and at the same time set the width-to-length ratio A11 of the first switching transistor M1 corresponding to the first driving circuit to be equal to the width-to-length ratio A12 of the first switching transistor M1 corresponding to the second pixel driving transistor circuit. Compared with the first switching transistor M1, the second switching transistor M2 is closer to the light-emitting element LD. When the width-to-length ratio of the second switching transistor M2 of the first pixel driving circuit 101 is set to be larger, it is more conducive to improving the capability of the first pixel driving circuit 101 to output the driving current and increasing the magnitude of the drive current output by the first pixel driving circuit 101, and thus is more conducive to reducing the difference between the light-emitting brightness of the first color light-emitting element LD1 and the light-emitting brightness of the second color light-emitting element LD2 and improving the display brightness uniformity. For example, $A12=K2\times A22$, and $K2>1.5$. The inventors have found upon research that when $K2<1.5$, the drive current output by the light-emitting branch 11 is not significantly improved, and when $K2>1.5$, the drive current output by the first pixel driving circuit can be effectively increased.

A third feasible implementation is to: set the width-to-length ratio A11 of the first switching transistor M1 corresponding to the first pixel driving circuit 101 to be greater than the width-to-length ratio A12 of the first switching transistor M1 corresponding to the second pixel driving circuit 102, and at the same time set the width-to-length ratio A21 of the second switching transistor M2 corresponding to the first pixel driving circuit 101 to be greater than the width-to-length ratio A22 of the second switching transistor M2 corresponding to the second pixel driving circuit 102. By simultaneously increasing the width-to-length ratio of the first switching transistor M1 and the second switching transistor M2 in the first pixel driving circuit 101, it is conducive to further increasing the drive current output by the first pixel driving circuit 101, reducing the difference between the light-emitting brightness of the first color light-emitting element LD1 and the light-emitting brightness of the second color light-emitting element LD2, and thus further improving the display brightness uniformity. Optionally, A11=K1×A12, and K1≥1.5; and A12=K2×A22, and K2≥1.5, and in this way, the drive current output by the first pixel driving circuit 101 is significantly improved.

Where the first pixel driving circuit 101 and the second pixel driving circuit 102 are embodied as structures corresponding to any one of the embodiments in FIG. 11 to FIG. 13, in an optional implementation of the present disclosure, the light-emitting branch 11 further includes a third transistor M3 connected in series between the first driving transistor M0 and the light-emitting element LD. A gate of the third transistor M3 is connected to the output terminal OUT of the pulse width modulation circuit 20; in the first pixel driving circuit 101, a width-to-length ratio of the third transistor M3 is A31; and in the second pixel driving circuit 102, a width-to-length ratio of the third transistor M3 is A32, where A31>A32.

Where the first pixel driving circuit 101 and the second pixel driving circuit 102 each include the third transistor M3, since the light-emitting efficiency of the first color light-emitting element LD1 connected to the first pixel driving circuit 101 is lower and lower than the light-emitting efficiency of the second color light-emitting element LD2 connected to the second pixel driving circuit 102, and here, on the premise that the width-to-length ratios of the first switching transistor M1 and the second switching transistor M2 in each of the first pixel driving circuit 101 and the second pixel driving circuit 102 satisfies A11>A12, and/or A21>A22, by further setting the width-to-length ratio A31 of the third transistor M3 in the first pixel driving circuit to be greater than the width-to-length ratio A32 of the third transistor M3 in the second pixel driving circuit 102, it is conducive to further improving the capability of the first pixel driving circuit 101 to output the drive current to further reduce the difference between the light-emitting brightness of the first light-emitting element LD and the light-emitting brightness of the second light-emitting element LD, thereby being conducive to improving the display brightness uniformity.

Optionally, the first color light-emitting element LD1 mentioned in the present disclosure is a red light-emitting element LD, and the second color light-emitting element LD2 is a green light-emitting element LD or a blue light-emitting element LD.

Figure 15:
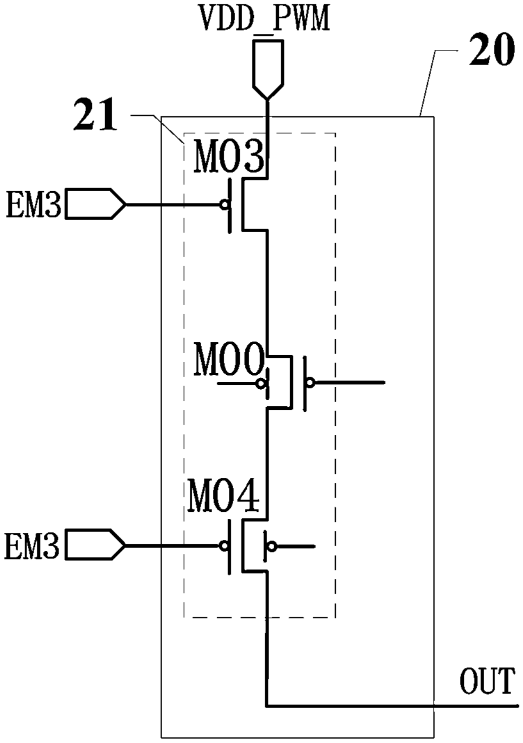
FIG. 15 is a structural schematic diagram of a pulse width modulation circuit in a pixel driving circuit provided by an embodiment of the present disclosure.

FIG. 15 shows a structural schematic diagram of the pulse width modulation circuit 20 in the pixel driving circuit provided by an embodiment of the present disclosure. Referring to FIG. 15, in an optional implementation of the present disclosure, the pulse width modulation circuit 20 includes an output branch 21 including a second driving transistor M00 and at least one switching transistor. The at least one transistor in the output branch 21 is a double-gate double-channel transistor. It should be noted that the embodiment shown in FIG. 15 only illustrates the structure of the output branch 21 in the pulse width modulation circuit 20, and does not represent all circuit structures of the pulse width modulation circuit 20. The pulse width modulation circuit 20 may further include structures such as a reset unit, a threshold compensation unit, and a data writing unit, which will be described in subsequent embodiments. It should be further noted that the output terminal of the pulse width modulation circuit 20 shown in FIG. 15 may be connected to the pulse amplitude modulation circuit 10 in any one of the foregoing embodiments.

Taking the embodiment shown in FIG. 15 as an example, the output branch 21 of the pulse width modulation circuit 20 may be regarded as a branch that is turned on in the output phase of the pulse width modulation circuit 20. When the output branch 21 is turned on, the pulse width modulation circuit 20 outputs a control signal to the pulse amplitude modulation circuit 10 to control the turn-on state of the light-emitting branch 11 of the pulse amplitude modulation circuit 10, thereby achieving the adjustment of the pulse width of the drive current provided to the light-emitting element LD. In this embodiment, the output branch 21 includes the second driving transistor M00 and the at least one switching transistor, and the at least one of the second driving transistor and the switching transistor is a double-gate double-channel transistor. The number of the transmission channels for an output signal is increased through the double-gate double-channel transistor, thereby being conducive to improving the capability of the pulse width modulation circuit 20 to output the control signal to the pulse amplitude modulation circuit 10, thereby being conducive to improving the capability of the pulse width modulation circuit 20 to turn off the light-emitting branch 11 of the pulse amplitude modulation circuit 10.

Figure 16:
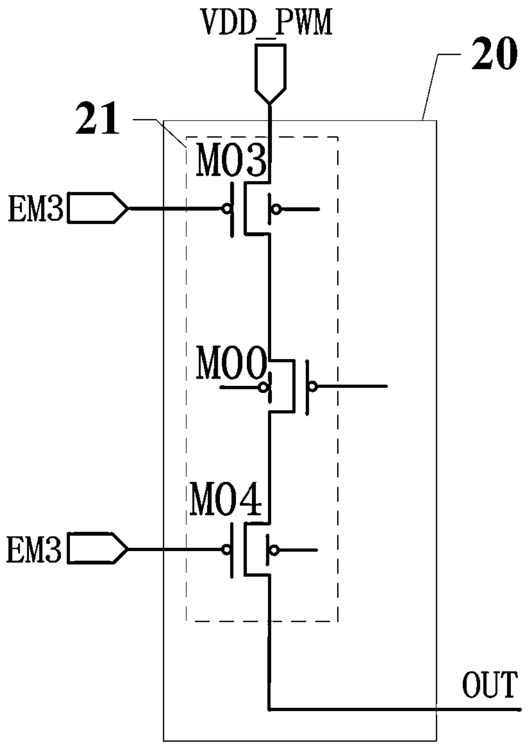
FIG. 16 is another structural schematic diagram of a pulse width modulation circuit in a pixel driving circuit provided by an embodiment of the present disclosure.

It should be noted that the embodiment shown in FIG. 15 shows only a solution in which the output branch 21 of the pulse width modulation circuit 20 includes the second driving transistor M00 and two switching transistors, and the second driving transistor M00 and one of the switching transistors are provided as double-gate double-channel transistors, but is not limited thereto. Referring to FIG. 16, which shows another structural schematic diagram of the pulse width modulation circuit 20 in the pixel driving circuit provided by an embodiment of the present disclosure. Optionally, the switching transistors in the pulse width modulation circuit 20 include a third switching transistor M03 and a fourth switching transistor M04. The second driving transistor M00 is connected in series between the third switching transistor M03 and the fourth switching transistor M04. A gate of the third switching transistor M03 and a gate of the fourth switching transistor M04 are both connected to a third switching control terminal EM3. The fourth switching transistor M04 is connected in series between the second driving transistor M00 and the output terminal OUT of the pulse width modulation circuit 20. The second driving transistor M00, the third switching transistor M03, and the fourth switching transistor M04 are double-gate double-channel transistors. It should be noted that the pulse width modulation circuit 20 in the embodiment shown in FIG. 16 may be combined with any one of the pulse amplitude modulation circuits in the foregoing embodiments to form the pixel driving circuit in the present disclosure.

In this embodiment, the output branch 21 in the pulse width modulation circuit 20 includes the third switching transistor M03, the second driving transistor M00, and the fourth switching transistor M04 that are connected in series, and the third switching transistor M03, the second driving transistor M00, and the fourth switching transistor M04 are all double-gate double-channel transistors. In the output phase of the pulse width modulation circuit 20, the third switching transistor M03, the second driving transistor M00, and the fourth switching transistor M04 are all turned on, and the control signal is transmitted through the two channels of each of the transistors in the output branch 21, thereby effectively improving the capability of the pulse width modulation circuit 20 to output the control signal to the pulse amplitude modulation circuit 10, thereby being conducive to improving the capability of the pulse width modulation circuit 20 to turn off the light-emitting branch 11 of the pulse amplitude modulation circuit 10, and at the same time being conducive to reducing the overall power consumption of the pixel driving circuit.

With continued reference to FIG. 16, in an optional implementation of the present disclosure, a width-to-length ratio of the third switching transistor M03 is A3, and a width-to-length ratio of the fourth switching transistor M04 is A4, A4=K4×A3, and K4≥2. In the transmission direction of the control signal of the output branch 21, the third switching transistor M03 is farther from the output terminal of the pulse width modulation circuit 20, the fourth switching transistor M04 is closer to the output terminal of the pulse width modulation circuit 20. The fourth switching transistor M04 is a transistor directly connected to the output terminal of the pulse width modulation circuit 20. The larger the width-to-length ratio of the transistor is, the stronger the driving capability is, and the more conducive to improving the capability of outputting the control signal. In this embodiment, the width-to-length ratio of the fourth switching transistor M04 directly connected to the pulse width modulation circuit 20 is set to be larger, which is more conducive to improving the capability of outputting the control signal to the pulse amplitude modulation circuit 10 and improving the transmission rate of the control signal, which in turn is more conducive to improving the capability of the pulse width modulation circuit 20 to turn off the pulse amplitude modulation circuit 10.

With reference to FIG. 14 to FIG. 16, in an optional implementation of the present disclosure, the pixel driving circuit includes the first pixel driving circuit 101 and the second pixel driving circuit 102. The first pixel driving circuit 101 is configured to be electrically connected to the first color light-emitting element LD1. The second pixel driving circuit 102 is configured to be electrically connected to the second color light-emitting element LD2. The light-emitting efficiency of the first color light-emitting element LD1 is less than the light-emitting efficiency of the second color light-emitting element LD2. In the first pixel driving circuit 101, a width-to-length ratio of the third switching transistor M03 is A31, and a width-to-length ratio of the fourth switching transistor M04 is A41. In the second pixel driving circuit 102, a width-to-length ratio of the third switching transistor M03 is A32, and a width-to-length ratio of the fourth switching transistor M04 is A42; where A31>A32, and/or A41>A42.

In this embodiment, the first pixel driving circuit 101 is connected to the first color light-emitting element LD1, the second pixel driving circuit 102 is connected to the second color light-emitting element LD2, and the light-emitting efficiency of the second color light-emitting element LD2 is higher than the light-emitting efficiency of the first color light-emitting element LD1. That is, in order to achieve the same brightness, the drive current required by the first color light-emitting element LD1 is greater than the drive current required by the second color light-emitting element LD2. Here, in addition to the differential design of the width-to-length ratios of the switching transistors in the pulse amplitude modulation circuits 10 corresponding to the first pixel driving circuit 101 and the second pixel driving circuit 102, the differential design of the width-to-length ratios of the switching transistors in the pulse width modulation circuits 20 may also be performed. For example, the width-to-length ratio A31 of the third switching transistor M03 in the first pixel driving circuit 101 is set to be greater than the width-to-length ratio A32 of the third switching transistor M03 in the second pixel driving circuit 102, and here, it can be set that A41=A42. Alternatively, the width-to-length ratio A41 of the fourth switching transistor M04 in the first pixel driving circuit 101 can be set to be greater than the width-to-length ratio A42 of the fourth switching transistor M04 in the second pixel driving circuit 102, and here, it can be set that A31=A32. Alternatively, the width-to-length ratio A31 of the third switching transistor M03 in the first pixel driving circuit 101 can be set to be greater than the width-to-length ratio A32 of the third switching transistor M03 in the second pixel driving circuit 102, and the width-to-length ratio A41 of the fourth switching transistor M04 in the first pixel driving circuit 101 can be set to be greater than the width-to-length ratio A42 of the fourth switching transistor M04 in the second pixel driving circuit 102, whereby the transmission efficiency of the data signal corresponding to the pulse width modulation circuit in the first pixel driving circuit 101 is improved, thereby improving the capability of the pulse width modulation circuit 20 in the first pixel driving circuit 101 to turn off the pulse amplitude modulation circuit 10, to ensure the accuracy of the emission brightness of the first color light-emitting element LD1 corresponding to the first pixel driving circuit 101.

Figure 17:
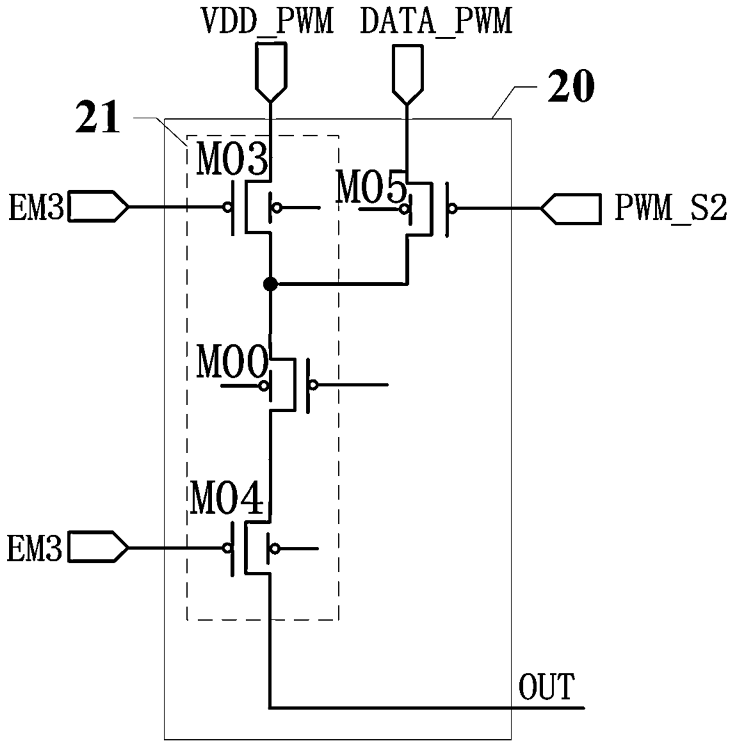
FIG. 17 is another structural schematic diagram of a pulse width modulation circuit in a pixel driving circuit provided by an embodiment of the present disclosure.

FIG. 17 is another structural schematic diagram of a pulse width modulation circuit 20 in a pixel driving circuit provided by an embodiment of the present disclosure. Referring to FIG. 17, in an optional implementation of the present disclosure, the pulse width modulation circuit 20 includes a second data writing transistor M05 connected in series between a second data signal terminal DATA_PWM and a first electrode of a second driving transistor M00. The first electrode of the second driving transistor M00 is connected to a third switching transistor M03. The second data writing transistor M05 is a double-gate double-channel transistor.

In this embodiment, when the second data writing transistor M05 in the pulse width modulation circuit 20 is turned on, the data signal from the second data signal terminal DATA_PWM can be transmitted to the second driving transistor M00. In the output phase of the pulse width modulation circuit 20, the magnitude of the control signal generated by the output branch 21 is related to the data signal from the second data signal terminal DATA_PWM. That is, the capability of the pulse width modulation circuit 20 to turn off the pulse amplitude modulation circuit 10 is related to the aforementioned data signal. In this embodiment, where the second data writing transistor M05 is provided as a double-gate double-channel transistor, it is conducive to improving the transmission rate of the data signal by the second data writing transistor M05 and the accuracy of the data signal, and improving the accuracy of the control signal transmitted by the pulse width modulation circuit 20 to the pulse amplitude modulation circuit 10, which in turn ensures the capability of the pulse width modulation circuit 20 to turn off the pulse amplitude modulation circuit 10.

Figure 18:
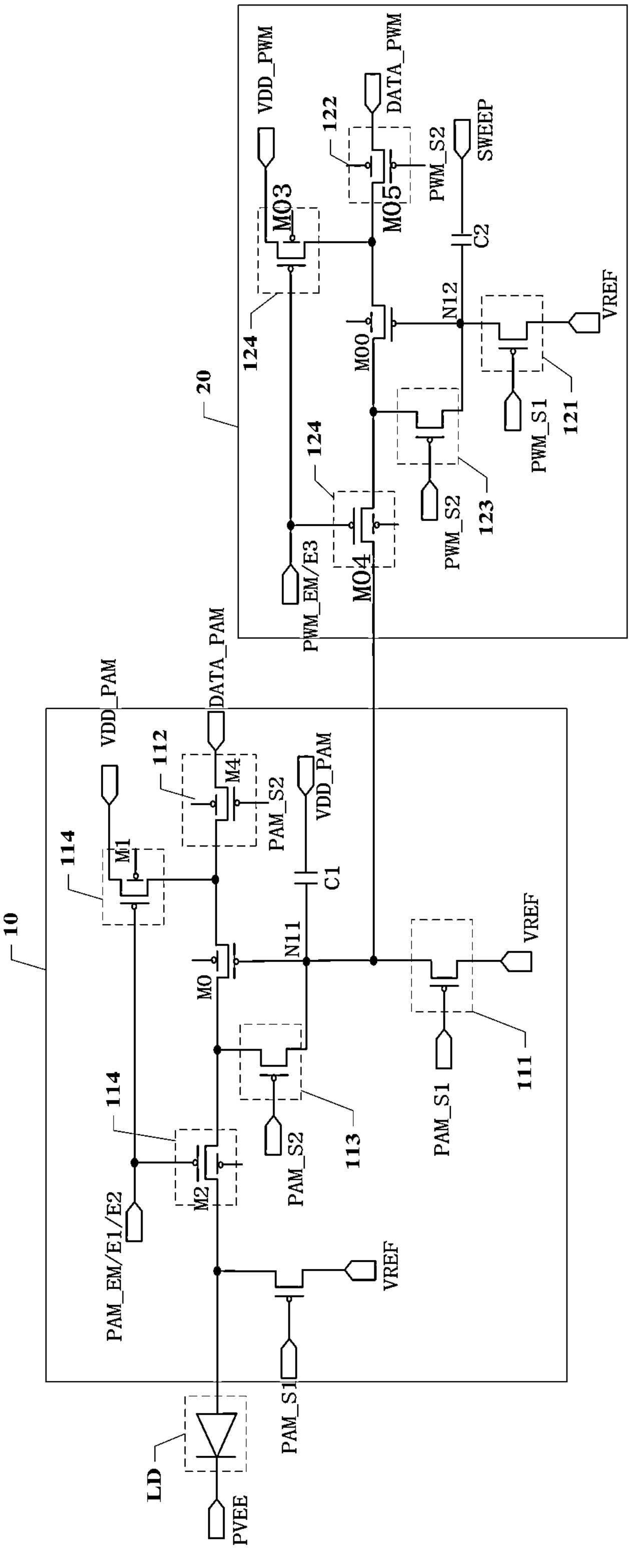
FIG. 18 is a schematic diagram of a pixel driving circuit provided by an embodiment of the present disclosure.
Figure 19:
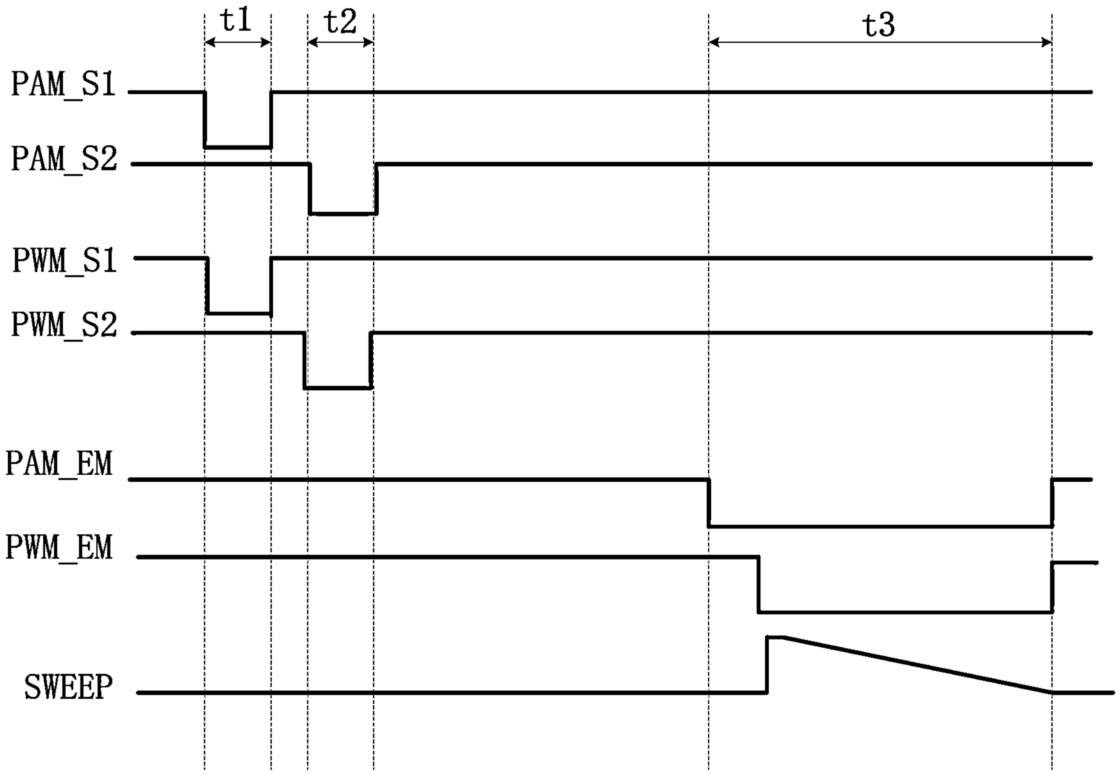
FIG. 19 is a timing diagram corresponding to FIG. 18.

The present disclosure will be further described below with reference to a specific structure of a pixel driving circuit. FIG. 18 is a schematic diagram of a pixel driving circuit provided by an embodiment of the present disclosure. FIG. 19 is a timing diagram corresponding to FIG. 18. Referring to FIG. 18 and FIG. 19, in an optional implementation of the present disclosure, the pixel driving circuit is configured to provide a drive current to a light-emitting element. The pixel driving circuit includes a pulse amplitude modulation circuit 10 and a pulse width modulation circuit 20. The pulse amplitude modulation circuit 10 is configured to control an amplitude of the drive current based on applied pulse amplitude modulation data, and the pulse width modulation circuit 20 is configured to control a pulse width of the drive current.

It should be noted that the pixel driving circuit shown in FIG. 18 is merely an example, the present disclosure does not limit the actual structure of the pixel driving circuit. In some other embodiments of the present disclosure, any other feasible structure of the pixel driving circuit may also be used. In the pixel driving circuit, the pulse width modulation circuit 20 is electrically connected to the pulse amplitude modulation circuit 10, and the pulse amplitude modulation circuit 10 is configured to be electrically connected to the light-emitting element.

Referring to FIG. 18 and FIG. 19, optionally, each of the pulse amplitude modulation circuit 10 and the pulse width modulation circuit 20 includes an initialization unit 111/121, a data writing unit 112/122, a threshold compensation unit 113/123, a light-emitting control unit 114/124, a storage capacitor C1/C2, and a driving transistor M0/M00. The pulse amplitude modulation circuit 10 includes the initialization unit 111, the data writing unit 112 (including a first data writing transistor M4), the threshold compensation unit 113, the light-emitting control unit 114 (including a first switching transistor M1 and a second switching transistor M2), the storage capacitor C1, and the driving transistor M0. The pulse width modulation circuit 20 includes the initialization unit 121, the data writing unit 122 (including a second data writing transistor M05), the threshold compensation unit 123, the light-emitting control unit 124 (including a third switching transistor M03 and a fourth switching transistor M04), the storage capacitor C2, and the driving transistor M00. This embodiment takes the first switching transistor M1, the second switching transistor M2, the first driving transistor M0, the third switching transistor M03, the fourth switching transistor M04, and the second driving transistor M00 being all double-gate double-channel transistors as an example for illustration. The initialization unit 111/121 is electrically connected between an initialization signal terminal VREF and a first node N11/N12. The initialization unit 111/121 is configured to provide an initialization signal of the initialization signal terminal VREF to the first node N11/N12 in the initialization phase t1 (values of the initialization signal provided by the initialization signal terminal of the pulse amplitude modulation circuit 10 and the initialization signal provided by the initialization signal terminal of the pulse width modulation circuit 20 may be the same or different). The data writing unit 112/122 is electrically connected between a data signal terminal DATA_PAM/DATA_PWM and a first electrode of the driving transistor M0/M00. A gate of the driving transistor M0/M00 and a first plate of the storage capacitor C1/C2 are electrically connected to the first node N11/N12. The data writing unit 112/122 is configured to provide the data voltage signal of the DATA-PAM/DATA-PWM data signal terminal to the first node N11/N12 through the driving transistor M0/M0 during the data writing phase t2. The threshold compensation unit 113/123 is electrically connected between a second electrode of the driving transistor M0/M00 and the first node N11/N12. The threshold compensation unit 113/123 is configured to compensate a threshold voltage of the driving transistor M0/M00 to the first node N11/N12.

In the pulse width modulation circuit 20, a second plate of the storage capacitor C2 is electrically connected to a sweep frequency signal terminal SWEEP, and sweep frequency signal terminal SWEEP receives a sweep frequency signal. The light-emitting control unit 124 is electrically connected between a first power supply terminal VDD_PWM and the first node N11 in the pulse amplitude modulation circuit 10. The light-emitting control unit 124 is configured to control the driving transistor M00 to generate a driving pulse in the light-emitting phase t3. The first power supply terminal VDD_PWM receives a first power supply voltage signal VDD_PWM (here, the signal terminal and the signal provided by the signal terminal are represented by the same reference sign), and the data signal terminal DATA_PWM receives a pulse width modulation data voltage DATA_PWM (here, the signal terminal and the signal provided by the signal terminal are represented by the same reference sign).

In the pulse amplitude modulation circuit 10, a second plate of the storage capacitor C1 is electrically connected to a power supply signal terminal VDD_PAM, and the power supply signal terminal VDD_PAM receives a second power supply voltage signal VDD_PAM (here, the signal terminal and the signal provided by the signal terminal are represented by the same reference sign). The light-emitting control unit 114 is electrically connected between the power supply signal terminal VDD_PAM and the light-emitting element LD. The light-emitting control unit 114 is configured to control the driving transistor M0 to generate the drive current flowing into the light-emitting element LD during the light-emitting phase, so as to drive the light-emitting element LD to emit light. The data signal terminal DATA_PAM receives a pulse amplitude modulation data voltage DATA_PAM (here, the signal terminal and the signal provided by the signal terminal are represented by the same reference sign).

In this embodiment, an output terminal of the pulse width modulation circuit 20 is electrically connected to the first node N11 of the pulse amplitude modulation circuit 10, to provide a control signal to the first node N11. Since the first node N11 is electrically connected to the gate of the driving transistor M0, which is equivalent to providing the control signal to the gate of the driving transistor M0. In the pulse width modulation circuit 20, when the voltage difference between the gate and the source of the driving transistor M00 is greater than the threshold voltage of the driving transistor M00, the driving transistor M00 is in an off state. At this point, the pulse width modulation circuit 20 does not provide the control signal to the first node N11 of the pulse amplitude modulation circuit 10, and the driving transistor M0 in the pulse amplitude modulation circuit 10 provides the drive current to the light-emitting element according to the pulse amplitude modulation data voltage DATA_PAM. As the voltage of the sweep frequency signal SWEEP changes, the gate potential of the driving transistor M00 changes synchronously until the voltage difference between the gate and the source of the driving transistor M00 is less than or equal to the threshold voltage of the driving transistor M00, and at this point, the driving transistor M00 is turned on. The driving transistor M00 transmits the first power supply voltage signal VDD_PWM of the first power supply terminal VDD PWM to the first node N11 of the pulse amplitude modulation circuit 10 as a cut-off voltage, so that the driving transistor M0 in the pulse amplitude modulation circuit 10 is turned off, thereby stopping providing the drive current to the light-emitting element LD.

It should be noted that the structure of the driving circuit shown in FIG. 18 is an optional example of the present disclosure, and does not limit the driving circuit of the display panel. For example, each of the pulse amplitude modulation circuit and the pulse width modulation circuit shown in FIG. 18 includes a threshold compensation unit to perform compensation on the threshold-voltage of the driving transistor when the data signal is written into the circuit, thereby ensuring that the driving transistor provides an accurate drive current, and avoiding being affected by the threshold voltage of the driving transistor during data writing. The embodiment of the present disclosure are also applicable to the structure of the driving circuit without a threshold compensation unit. For example, the pulse amplitude modulation circuit and the pulse width modulation circuit shown in FIG. 18 are modified to: remove the threshold compensation unit 113/123; and adjust the data writing unit 112/122 to be connected between the data signal terminal DATA_PAM/DATA_PWM and the gate of the driving transistor M0/M00, to provide the data voltage signal of the data signal terminal DATA_PAM/DATA_PWM to the first node N11/N12 through the data writing unit in the data writing phase. This disclosure does not limit the specific structure of the pixel driving circuit.

In addition, in order to reduce the leakage currents of other transistors in the pixel driving circuit to the first node, the pulse amplitude modulation circuit and the pulse width modulation circuit shown in FIG. 18 may also be modified to: adjust the initialization unit 111 and the threshold compensation unit 113 connected to the driving transistor M0 in the pulse amplitude modulation circuit and the initialization unit 121 and the threshold compensation unit 123 connected to the driving transistor M00 in the pulse width modulation circuit to be transistors, oxide transistors, or the like, each of which has a double-gate structure.

Figure 20:
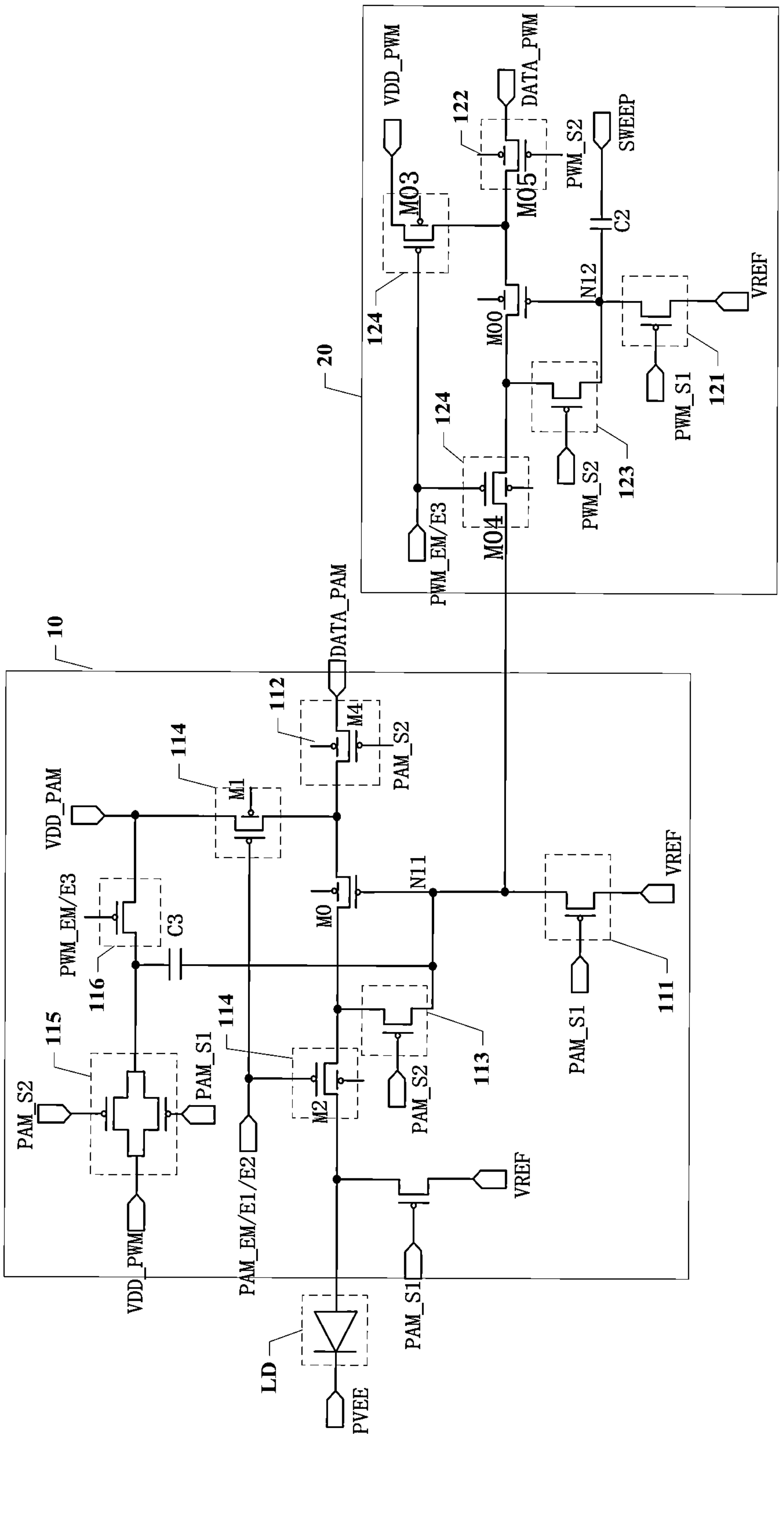
FIG. 20 is another schematic diagram of a pixel driving circuit provided by an embodiment of the present disclosure.

FIG. 20 is another schematic diagram of a pixel driving circuit provided by an embodiment of the present disclosure, in which both the pulse amplitude modulation circuit 10 and the pulse width modulation circuit 20 include an initialization unit 111/121, a data writing unit 112/122, a threshold compensation unit 113/123, a light-emitting control unit 114/124, a storage capacitor C1/C2, and a driving transistor M0/M00. The embodiment shown in FIG. 20 is the same as the embodiment shown in FIG. 18, and for the operation principle of the embodiment shown in FIG. 20, reference can be made to the description related to the embodiment shown in FIG. 18, and the operation principle will not be repeated here. One difference between the embodiment shown in FIG. 20 and the embodiment shown in FIG. 18 is that the pulse amplitude modulation circuit 110 in FIG. 20 further includes a first voltage stabilization module 115 and a second voltage stabilization module 116. The first voltage stabilization module 115 includes two transistors. Gates of the two transistors are respectively connected to the control signals PAM_S1 and PAM_S2. First electrodes of the two transistors are connected to the power supply voltage terminal VDD_PWM, second electrodes of the two transistors are connected to a first plate of the capacitor C3, and a second plate of the capacitor C3 is connected to the first node N11 of the pulse amplitude modulation circuit 10. The first voltage stabilization module 115 is configured to write a reference voltage VDD_PWM to the first plate of the capacitor C3 in a first period in which the pulse amplitude modulation circuit 110 operates and to write a power supply voltage signal VDD_PWM to the first plate of the capacitor C3 in a second period in which the pulse amplitude modulation circuit 110 operates. The first period is, for example, an initialization period t1 of the timing corresponding to FIG. 19, and the second period is, for example, a data writing period t2 of the timing corresponding to FIG. 19. In this way, in the first period and the second period, due to the coupling effect of the capacitor C3, the stabilizing effect on the potential of the first node N11 is achieved, that is, the stabilizing effect on the gate potential of the first driving transistor M0 is achieved. The second voltage stabilization module 116 includes a transistor, which is connected between the power supply voltage terminal VDD_PAM and the first plate of the capacitor C3, and a gate of the transistor is connected to the control signal PWM_EM. In this way, when the pulse width modulation circuit transmits the control signal to the pulse amplitude modulation circuit, the second voltage stabilization module 116 can achieve the stabilizing effect on the potential of the first node N11 to avoid causing a change in the drive current due to the change in the gate potential of the first driving transistor M0, thereby being conducive to improving the accuracy of the drive current output by the pulse amplitude modulation circuit.

It should be noted that in practical applications, the power supply voltage signal VDD_PAM corresponding to the pulse amplitude modulation circuit and the power supply voltage signal VDD_PWM corresponding to the pulse width modulation circuit may be set to be the same or different according to actual needs, which is not specifically limited in the present disclosure. In the embodiment of the present disclosure, only take the transistors in the pixel driving circuit being all P-type transistors as an example for illustration, but the present disclosure is not limited thereto. In some other embodiments of the present disclosure, all of the transistors in the pixel driving circuit may also be provided as N-type transistors; or a part of the transistors may be provided as P-type transistors, and the other part of the transistors may be provided as N-type transistors.

It should be further noted that the structure of any of the pulse amplitude modulation circuits 10 in the foregoing embodiments and the structure of any of the pulse width modulation circuits 20 in other embodiments may be combined. In addition, any of the connection manner in FIG. 6, FIG. 9, or FIG. 10 can be employed to connect the pulse amplitude modulation circuit 10 and the pulse width modulation circuit 20. It should also be noted that other structures of the pulse amplitude modulation circuit 10, other structures of the pulse width modulation circuit 20, and other manners of the connection between the pulse amplitude modulation circuit 10 and the pulse width modulation circuit 20 are all applicable to the implementations described in the present disclosure.

Figure 21:
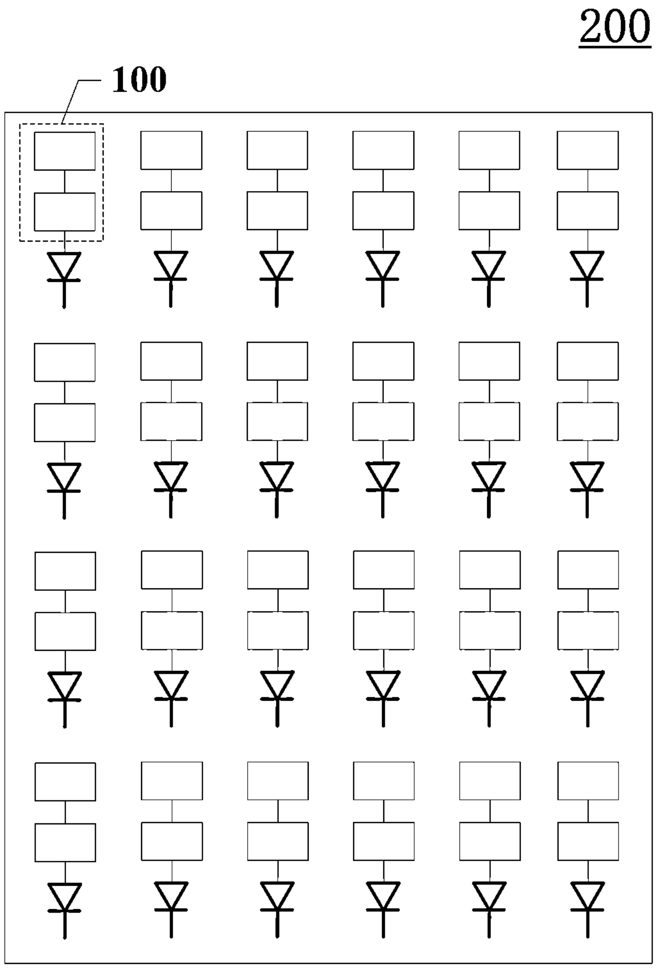
FIG. 21 is a structural schematic diagram of a display apparatus provided by an embodiment of the present disclosure.

Based on the same inventive concept, the present disclosure further provides a display apparatus. FIG. 21 is a structural schematic diagram of the display apparatus 200 provided by an embodiment of the present disclosure. Referring to FIG. 21, the display apparatus 200 includes the pixel driving circuit in any of the above embodiments. The display apparatus 200 provided by the embodiment of the present disclosure may be any electronic device having a display function, such as a touch display screen, a mobile phone, a tablet computer, a notebook computer, an e-book or a television. The display apparatus 200 provided by the embodiment of the present disclosure has the beneficial effects of the pixel driving circuits provided by the embodiments of the present disclosure. For details, reference may be made to the specific description of the pixel driving circuits in the above embodiments, and the details will not be repeated here in this embodiment.

It may be understood that FIG. 21 only illustrates a shape of the display apparatus 200 by taking a rectangular structure as an example. In some other embodiments of the present disclosure, the display apparatus 200 may also be embodied as a circle, an ellipse or any other feasible shape, which is not specifically limited in the present disclosure.

It should be noted that in the document, relational terms such as "first" and "second" are used only to distinguish one entity or operation from another entity or operation, and do not necessarily require or imply the existence of any such actual relationship or order between those entities or operations. Furthermore, terms "including", "comprising", or any other variant thereof, are intended to cover non-exclusive inclusion, such that a process, method, article, or apparatus comprising a set of elements includes not only those elements, but also other elements that are not expressly listed or that are inherent to such a process, method, article or apparatus. Without further limitation, the fact that an element is defined by the phrase "includes a . . . " does not preclude the existence of additional identical elements in the process, method, article or apparatus that includes said element.

The above description is only specific implementations of the present disclosure, so that those skilled in the art can understand or implement the present disclosure. Various modifications to these embodiments will be apparent to those skilled in the art, and the general principles defined herein may be implemented in other embodiments without departing from the spirit or scope of the present disclosure. Accordingly, the present disclosure will not be limited to these embodiments described herein, but should be consistent with the broadest scope consistent with the principles and novel features disclosed herein.

What is claimed is:

1. A pixel driving circuit, comprising a pulse amplitude modulation circuit and a pulse width modulation circuit which are electrically connected to each other, wherein the pulse amplitude modulation circuit is electrically connected to a light-emitting element to provide a drive current to the light-emitting element; and the pulse amplitude modulation circuit is configured to control an amplitude of the drive current, and the pulse width modulation circuit is configured to control a pulse width of the drive current;

the pulse amplitude modulation circuit comprises a light-emitting branch connected to the light-emitting element, and the light-emitting branch comprises a first driving transistor, a first switching transistor, and a second switching transistor, wherein the first driving transistor is connected in series between the first switching transistor and the second switching transistor, and the second switching transistor is connected in series between the first driving transistor and the light-emitting element;

the pixel driving circuit comprises a first pixel driving circuit and a second pixel driving circuit, the first pixel driving circuit is configured to be electrically connected to a first color light-emitting element, the second pixel driving circuit is configured to be electrically connected to a second color light-emitting element; and in the first pixel driving circuit, a width-to-length ratio of the first switching transistor is A11, and a width-to-length ratio of the second switching transistor is A21; and in the second pixel driving circuit, a width-to-length ratio of the first switching transistor is A12, and a width-to-length ratio of the second switching transistor is A22; where A11>A12, and/or A21>A22.

2. The pixel driving circuit according to claim 1, wherein the first switching control terminal and the second switching control terminal are a same switching control terminal; or wherein an output terminal of the pulse width modulation circuit is connected to a gate of the first driving transistor, or an output terminal of the pulse width modulation circuit is connected to a gate of the first driving transistor through a capacitor.

3. The pixel driving circuit according to claim 1, wherein a width-to-length ratio of the first switching transistor is A1, a width-to-length ratio of the second switching transistor is A2, where A2=K×A1, and K≥2.

4. The pixel driving circuit according to claim 1, wherein the light-emitting branch further comprises a third transistor connected in series between the first driving transistor and the light-emitting element, and a gate of the third transistor is connected to an output terminal of the pulse width modulation circuit.

5. The pixel driving circuit according to claim 4, wherein the third transistor is connected in series between the first driving transistor and the second switching transistor; and a width-to-length ratio of the third transistor is A3, a width-to-length ratio of the first switching transistor is A1, and a width-to-length ratio of the second switching transistor is A2, where A1<A3<A2.

6. The pixel driving circuit according to claim 4, wherein the third transistor is connected in series between the second switching transistor and the light-emitting element; and a width-to-length ratio of the third transistor is A3, a width-to-length ratio of the first switching transistor is A1, and a width-to-length ratio of the second switching transistor is A2, where A1<A2<A3.

7. The pixel driving circuit according to claim 6, wherein the third transistor is a four-gate four-channel transistor.

8. The pixel driving circuit according to claim 1, wherein the pulse amplitude modulation circuit further comprises a first data writing transistor connected in series between a first data signal terminal and a first electrode of the first driving transistor, and the first electrode of the first driving transistor is connected to the first switching transistor; and the first data writing transistor is a double-gate double-channel transistor.

9. The pixel driving circuit according to claim 1, wherein the double-gate double-channel transistor comprises a substrate, and an active layer, a bottom gate, and a top gate that are located on a same side of the substrate; in a first direction, the bottom gate and the top gate are respectively located on two sides of the active layer, the bottom gate is located between the active layer and the substrate, and the first direction is perpendicular to a plane where the substrate is located;

an outer edge of an orthographic projection of the bottom gate on a plane where the active layer is located is a first edge, an outer edge of an orthographic projection of the top gate on the plane where the active layer is located is a second edge, and the first edge is peripheral to the second edge.

10. The pixel driving circuit according to claim 1, wherein A11=K1×A12, and K1≥1.5; and/or A12=K2×A22, and K2≥1.5.

11. The pixel driving circuit according to claim 1, wherein the light-emitting branch further comprises a third transistor connected in series between the first driving transistor and the light-emitting element, and a gate of the third transistor is connected to an output terminal of the pulse width modulation circuit; in the first pixel driving circuit, a width-to-length ratio of the third transistor is A31; and in the second pixel driving circuit, a width-to-length ratio of the third transistor is A32; where A31>A32.

12. The pixel driving circuit according to claim 1, wherein the pulse width modulation circuit comprises an output branch comprising a second driving transistor and at least one switching transistor, and the at least one transistor in the output branch is a double-gate double-channel transistor.

13. The pixel driving circuit according to claim 12, wherein the switching transistor in the pulse width modulation circuit comprises a third switching transistor and a fourth switching transistor, the second driving transistor is connected in series between the third switching transistor and the fourth switching transistor, a gate of the third switching transistor and a gate of the fourth switching transistor are both connected to a third switching control terminal, and the fourth switching transistor is connected in series between the second driving transistor and an output terminal of the pulse width modulation circuit; and the second driving transistor, the third switching transistor, and the fourth switching transistor are double-gate double-channel transistors.

14. The pixel driving circuit according to claim 13, wherein a width-to-length ratio of the third switching transistor is A3, and a width-to-length ratio of the fourth switching transistor is A4, where A4=K4×A3, and K4≥2.

15. The pixel driving circuit according to claim 13, wherein the pulse width modulation circuit comprises a second data writing transistor connected in series between a second data signal terminal and a first electrode of the second driving transistor, the first electrode of the second driving transistor is connected to the third switching transistor; and the second data writing transistor is a double-gate double-channel transistor.

16. The pixel driving circuit according to claim 13, wherein the pixel driving circuit comprises a first pixel driving circuit and a second pixel driving circuit, the first pixel driving circuit is configured to be electrically connected to a first color light-emitting element, the second pixel driving circuit is configured to be electrically connected to a second color light-emitting element, and a light-emitting efficiency of the first color light-emitting element is less than a light-emitting efficiency of the second color light-emitting element; and in the first pixel driving circuit, a width-to-length ratio of the third switching transistor is A31, and a width-to-length ratio of the fourth switching transistor is A41; in the second pixel driving circuit, a width-to-length ratio of the third switching transistor is A32, and a width-to-length ratio of the fourth switching transistor is A42; where A31>A32, and/or A41>A42.

17. A display apparatus, comprising a pixel driving circuit, wherein pixel driving circuit comprises a pulse amplitude modulation circuit and a pulse width modulation circuit which are electrically connected to each other, wherein the pulse amplitude modulation circuit is electrically connected to a light-emitting element to provide a drive current to the light-emitting element; and the pulse amplitude modulation circuit is configured to control an amplitude of the drive current, and the pulse width modulation circuit is configured to control a pulse width of the drive current;

the pulse amplitude modulation circuit comprises a light-emitting branch connected to the light-emitting element, and the light-emitting branch comprises a first driving transistor, a first switching transistor, and a second switching transistor, wherein the first driving transistor is connected in series between the first switching transistor and the second switching transistor, and the second switching transistor is connected in series between the first driving transistor and the light-emitting element;

the pixel driving circuit comprises a first pixel driving circuit and a second pixel driving circuit, the first pixel driving circuit is configured to be electrically connected to a first color light-emitting element, the second pixel driving circuit is configured to be electrically connected to a second color light-emitting element; and in the first pixel driving circuit, a width-to-length ratio of the first switching transistor is A11, and a width-to-length ratio of the second switching transistor is A21; and in the second pixel driving circuit, a width-to-length ratio of the first switching transistor is A12, and a width-to-length ratio of the second switching transistor is A22; where A11>A12, and/or A21>A22.

18. A pixel driving circuit, comprising a pulse amplitude modulation circuit and a pulse width modulation circuit which are electrically connected to each other, wherein the pulse amplitude modulation circuit is electrically connected to a light-emitting element to provide a drive current to the light-emitting element; and the pulse amplitude modulation circuit is configured to control an amplitude of the drive current, and the pulse width modulation circuit is configured to control a pulse width of the drive current;

the pulse width modulation circuit comprises a second driving transistor and at least one switching transistor;

wherein the switching transistor in the pulse width modulation circuit comprises a third switching transistor and a fourth switching transistor, the second driving transistor is connected in series between the third switching transistor and the fourth switching transistor, and the fourth switching transistor is connected in series between the second driving transistor and an output terminal of the pulse width modulation circuit;

the pixel driving circuit comprises a first pixel driving circuit and a second pixel driving circuit, the first pixel driving circuit is configured to be electrically connected to a first color light-emitting element, the second pixel driving circuit is configured to be electrically connected to a second color light-emitting element; and in the first pixel driving circuit, a width-to-length ratio of the third switching transistor is A31, and a width-to-length ratio of the fourth switching transistor is A41; in the second pixel driving circuit, a width-to-length ratio of the third switching transistor is A32, and a width-to-length ratio of the fourth switching transistor is A42; where A31>A32, and/or A41>A42.

19. A display apparatus, comprising the pixel driving circuit according to claim 18.

* * * * *